(12) United States Patent
Rostalski et al.

(10) Patent No.: US 6,891,596 B2
(45) Date of Patent: May 10, 2005

(54) REFRACTIVE PROJECTION OBJECTIVE FOR IMMERSION LITHOGRAPHY

(75) Inventors: Hans-Juergen Rostalski, Berlin (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/379,809

(22) Filed: Mar. 6, 2003

(65) Prior Publication Data

US 2003/0174408 A1 Sep. 18, 2003

(30) Foreign Application Priority Data

Mar. 8, 2002 (DE) ........................................ 102 10 899

(51) Int. Cl.$^7$ .......................... G03B 27/42; G02B 9/00; G02B 9/60
(52) U.S. Cl. .......................... 355/53; 359/649; 359/754; 359/763
(58) Field of Search .............................. 355/53, 67, 77; 359/618, 649, 682, 683, 690, 754, 784, 785

(56) References Cited

U.S. PATENT DOCUMENTS

| 4,480,910 A | 11/1984 | Takanashi et al. |
| 4,509,852 A | 4/1985 | Tabarelli et al. |
| 5,121,256 A | 6/1992 | Corle et al. |
| 5,610,683 A | 3/1997 | Takahashi |

(Continued)

FOREIGN PATENT DOCUMENTS

| EP | 0 023 231 A1 | 2/1981 |
| EP | 1061396 A2 | 12/2000 |
| EP | 1 094 350 A2 | 4/2001 |
| EP | 1 139 138 A1 | 10/2001 |
| WO | WO 01/51979 A2 | 7/2001 |
| WO | WO 01/65296 A1 | 9/2001 |
| WO | WO 02/091078 A1 | 11/2002 |
| WO | WO 03/075097 A3 | 9/2003 |

OTHER PUBLICATIONS

M. Switkes and M. Rothschild "Immersion Lithography at 157 NM", J. Vac. Sci. Technol. B 19(6), pp. 2353–2356, Nov./Dec. 2001.

Hiroaki Kawata, et al, "Fabrication of 0.2 $\mu$M Fine Patterns Using Optical Projection Lithography with an Oil Immersion Lens", Japanese Journal of Applied Physics, vol. 31, pp. 4174–4177, Part 1, No. 12B, Dec. 1992, Tokyo Japan.

Hiroaki Kawata, et al, "Optical Projection Lithography Using Lenses with Numerical Apertures Greater Than Unity", Microelectronic Engineering, Nos. 1–4, May 1989, Amsterdam, Netherlands.

Willi Ulrich, et al, Trends in Optical Design of Projection Lenses for UV–and EUV—Lithography, Proceedings of SPIE vol. 4146, pp. 13–24, Aug. 2000, Bellingham, Virginia.

*Primary Examiner*—Alan Mathews
(74) *Attorney, Agent, or Firm*—Sughrue Mion, PLLC

(57) ABSTRACT

A purely refractive projection objective suitable for immersion micro-lithography is designed as a single-waist system with five lens groups, in the case of which a first lens group with a negative refracting power, a second lens group with a positive refracting power, a third lens group with a negative refracting power, a fourth lens group with a positive refracting power and a fifth lens group with a positive refracting power are provided. The system aperture is in the region of maximum beam diameter between the fourth and the fifth lens group. Embodiments of projection objectives according to the invention achieve a very high numerical aperture of NA>1 in conjunction with a large image field, and are distinguished by a good optical correction state and moderate overall size. Pattern widths substantially below 100 nm can be resolved when immersion fluids are used between the projection objective and substrate in the case of operating wavelengths below 200 nm.

113 Claims, 4 Drawing Sheets

U.S. PATENT DOCUMENTS

| | | |
|---|---|---|
| 5,900,354 A | 5/1999 | Batchelder |
| 5,986,824 A | 11/1999 | Mercado |
| 6,008,884 A | 12/1999 | Yamaguchi et al. |
| 6,560,031 B1 | 5/2003 | Shafer et al. |
| 2002/0005938 A1 | 1/2002 | Nikon Corporation Omura |
| 2002/0024741 A1 | 2/2002 | Terasawa et al. |
| 2002/0163629 A1 * | 11/2002 | Switkes et al. ............... 355/53 |
| 2003/0206282 A1 * | 11/2003 | Omura ....................... 355/67 |

* cited by examiner

REFRACTIVE PROJECTION OBJECTIVE FOR IMMERSION LITHOGRAPHY

The following disclosure is based on German Patent Application No. DE 102 10 899.4 filed on Mar. 8, 2002, which is incorporated into this application by reference.

BACKGROUND OF THE INVENTION

1. Field of the Invention

The invention relates to a refractive projection objective for projecting a pattern arranged in an object plane of the projection objective into an image plane of the projection objective with the aid of an immersion medium which is arranged between a last optical element of the projection objective and the image plane.

2. Description of the Related Art

Photo-lithographic projection objectives have been in use for several decades for producing semiconductor components and other finely structured structural elements. They serve the purpose of projecting patterns of photomasks or reticles, which are also denoted below as masks or reticles, onto an object coated with a photosensitive layer with very high resolution on a reducing scale.

Three developments running in parallel chiefly contribute to the production of every finer structures of the order of magnitude of 100 nm or below. Firstly, an attempt is being made to increase the image-side numerical aperture (NA) of the projection objective beyond the currently customary values into the region of NA=0.8 or above. Secondly, ever shorter wavelengths of ultraviolet light are being used, preferably wavelengths of less than 260 nm, for example 248 nm, 193 nm, 157 nm or below. Finally, still other measures are being used to increase resolution, for example phase-shifting masks and/or oblique illumination.

In addition, there are already approaches to improving the achievable resolution by introducing an immersion medium of high refractive index into the space between the last optical element of the projection objective and the substrate. This technique is denoted here as immersion lithography. Introducing the immersion medium yields an effective wavelength of $$\lambda_{eff} = \lambda_0 / n,$$

$\lambda_0$ being the vacuum operating wavelength and n the refractive index of the immersion medium. This yields a resolution of $$R = k_1 (\lambda_{eff} / NA_0)$$

and a depth of focus (DOF) of $$DOF = \pm k_2 (\lambda_{eff} / NA_0^2),$$

$NA_0 = \sin \Theta_0$ being the "dry" numerical aperture, and $\Theta_0$ being half the aperture angle of the objective. The empirical constants $k_1$ and $k_2$ depend on the process.

The theoretical advantages of immersion lithography reside in the reduction of the effective operating wavelength and the resolution improved thereby. This can be achieved in conjunction with an unchanged vacuum wavelength, and so established techniques for producing light for selecting optical materials, for coating technology etc. can be adopted largely without change for the appropriate wavelength. However, measures are required for providing projection objectives with very high numerical apertures in the region of NA=1 or above. Furthermore, suitable immersion media must be available.

The article entitled "Immersion Lithography at 157 nm" by M. Switkes and M. Rothschild, J. Vac. Sci. Technol. Vol. 19 (6), November/December 2001, pages 1 ff. presents immersion fluids based on perfluoropolyethers (PFPE) which are sufficiently transparent for a working wavelength of 157 nm and are compatible with some photo-resist materials currently being used in micro-lithography. One tested immersion fluid has a refractive index of n=1.37 at 157 nm. The publication also describes a lens-free optical system, operating with calcium fluoride elements and silicon mirrors, for immersion interference lithography, which is intended to permit the projection of 60 nm structures and below in conjunction with a numerical aperture of NA=0.86. The optical system may not be suitable for use in the series production of semiconductors or the like.

U.S. patent specification U.S. Pat. No. 5,610,683 (corresponding to EP 0 605 103) describes a projection exposure machine, provided for immersion lithography, having devices for introducing immersion fluid between the projection objective and the substrate. No design is specified for the optical projection system.

U.S. patent specification U.S. Pat. No. 5,900,354 proposes using a super-critical fluid, for example xenon gas, as immersion medium in immersion lithography. No design is shown for a suitable projection objective.

SUMMARY OF THE INVENTION

It is one object of the invention to provide a refractive projection objective which is suitable for immersion lithography and which has, in conjunction with a moderate overall size, a high numerical aperture suitable for immersion lithography, an image field which is sufficiently large for practical use in wafer steppers or wafer scanners, and a good correction state.

As a solution to this and other objects, the invention, according to one formulation, provides a refractive projection objective for projecting a pattern arranged in an object plane of the projection objective into the image plane of the projection objective with the aid of an immersion medium which is arranged between a last optical element of the projection objective and the image plane having:

- a first lens group, following the object plane, with a negative refracting power;
- a second lens group, following thereupon, with a positive refracting power;
- a third lens group, following thereupon, with a negative refracting power;
- a fourth lens group, following thereupon, with a positive refracting power;
- a fifth lens group, following thereupon, with a positive refracting power; and
- a system aperture which is arranged in the region of maximum beam diameter between the fourth lens group and the fifth lens group.

Advantageous embodiments are specified in the dependent claims. The wording of all the claims is incorporated in the description by reference.

This refracting power distribution produces a projection objective having two bellies and a waist therebetween, a good correction of the field curvature thereby being achieved. The system aperture is seated in the region of greatest beam diameter of the belly next to the image plane, preferably at least 90% or 95% of the maximum beam diameter being present in the belly near the image at the location of the system aperture. In certain embodiments, the system aperture can lie between a plane of maximum beam diameter near the image and the image plane, and thus in a region in which the transilluminated diameter of the objective already decreases towards the image plane. This is a substantial difference from conventional, refractive projection objectives in which the system aperture lies on the object side at a relatively large distance in front of the region of maximum beam diameter in the belly near the image.

The design permits image-side numerical apertures NA≧0.9, it being possible in the case of preferred embodiments to achieve NA=1.1 or above. Preferred projection objectives are adapted to an immersion fluid which has a refractive index of n>1.3 at the operating wavelength. As a result, a reduction in the effective operating wavelength by 30% or more can be achieved by a comparison with systems without immersion.

The projection objective can advantageously be designed such that the space to be filled up by the immersion medium has an axial thickness which is so small that transmission losses in the immersion medium are no more than 10 to 20% of the penetrating light intensity. Consequently, image-side working distances of less than 200 $\mu$m, in particular less than 100 $\mu$m, are favorable. Since, on the other hand, touch contact between the last optical element and the substrate surface is to be avoided, a lower limit for the working distance of from 10 to 20 $\mu$m should not be undershot. Larger working distances in the region of one or more millimeters are also possible given suitably transparent immersion media.

Preferred projection objectives are distinguished by a number of favorable structural and optical features which are necessary alone or in combination for the suitability of the objective as an immersion objective.

For example, it can be favorable when the refracting powers of the lens groups are of the same order of magnitude on both sides of the system aperture. In particular, it can be provided that a ratio between the focal length of the fourth lens group and the focal length of the fifth lens group is between approximately 0.9 and approximately 1.1. It can likewise be favorable when the focal lengths or refracting powers of the lens groups near the object and lens groups near the image are similar in magnitude. In particular, a ratio of the magnitudes of the focal lengths of the first lens group and the fifth lens group can be between approximately 0.7 and approximately 1.3, preferably between approximately 0.9 and 1.1. Furthermore, it can be favorable for producing a high image-side numerical aperture when a strong positive refracting power is concentrated in the region near the image. In preferred embodiments, a ratio between the overall length of the projection objective and the focal length of the fifth lens group following the system aperture is greater than five, in particular greater than six, seven or even eight. The axial distance between the object plane and image plane is denoted here as overall length.

In order to achieve a good correction state, it is provided in preferred embodiments that the first lens group includes at least one aspheric surface. Favorably, it is even possible for a plurality of aspherics, for example two, to be provided here. Aspherics in this region make a particularly effective contribution to the correction of distortion and astigmatism. It is favorable, furthermore, for the correction of coma and astigmatism when the third lens group, situated in the region of the waist, has at least one aspheric surface, a plurality of aspherics, for example two aspherics, being preferred. In the case of preferred embodiments, at least one aspheric is provided in each lens group in order to facilitate fine setting of the correction state of the projection objective. With regard to simple production of the lenses, the number of aspherics should be limited, for example to less than nine or less than seven, as in the case of a preferred embodiment.

The favorable projection properties of projection objectives according to the invention, particularly the good correction state in the case of a very high numerical aperture, are promoted by some special features relating to the type and arrangement of the lenses used. For example, it is favorable when at least one meniscus lens, convex relative to the object plane, with a negative refracting power is arranged in the near zone of the object plane, in particular in the first lens group. This lens, which can form the third lens of the objective, for example, favors the correction of tangential astigmatism.

The second lens group preferably has at least one, in particular a plurality of meniscus lenses, concave relative to the object plane, with a positive refracting power on its side facing the object plane. These preferably combine with at least one, preferably a plurality of meniscus lenses, convex relative to the object plane, with a positive refracting power on the side, facing the image plane, of the second lens group. At least one biconcave positive lens is favorably situated between the menisci or meniscus groups of the opposing bending. As a result, a sequence of at least one positive meniscus lens, concave relative to the object plane, a biconvex positive lens and at least one positive meniscus lens, concave relative to the image plane, can be formed in the second lens group. This sequence of lenses in the region of relatively large beam diameter of the first belly is favorable for a strong "deformation" of the main ray in this region in conjunction with low areal stresses of the optical surfaces. This is favorable for low total aberrations of the projection objective. A favorable areal stress in the sense of this application occurs whenever the incidence angles of the rays striking an optical surface are as small as possible and do not overshoot a critical limit value. Denoted here as incidence angle is the angle between the impingement direction of a ray on an optical surface and the surface normal of the optical surface at the impingement point of the ray. The smaller the incidence angle and, correspondingly, the lower the areal stress, the easier is the development of suitable antireflection coatings, and the greater is the tolerance of the design to the adjustment.

The region of narrowest constriction of the ray is denoted as the waist. The third lens group in the region of the waist has the task of re-expanding the radiation, converging downstream of the first belly, with as few aberrations as possible. It is favorable for this purpose when the third lens group has only lenses with a negative refracting power. It has proved to be particularly advantageous when, with reference to a plane of symmetry lying inside the third lens group, the third lens group is of substantially symmetrical construction. This is distinguished, in particular, by virtue of the fact that mutually assigned lenses of the same type are arranged on the object side and image side of the plane of symmetry. The symmetry of the lens types preferably also extends into the bordering region of the second and fourth lens groups such that an exit region, facing the third lens group, of the second lens group, and an entry region, following the third lens group, of the fourth lens group can be constructed substantially symmetrically relative to the plane of symmetry lying inside the third lens group. A symmetrical arrangement of negative and positive meniscus lenses will be explained in further detail in conjunction with the embodiments. The symmetry promotes a low areal stress of the lenses in conjunction with few aberrations.

At least one doublet with a biconvex positive lens and a meniscus-shaped negative lens, following towards the image, with lens surfaces which are concave towards the object is preferably provided in the region directly upstream of the system aperture, that is to say in the fourth lens group. Particularly favorable are embodiments having two such doublets which can follow one another directly. A positive air lens, convex relative to the image plane, is respectively arranged between the lenses of the doublet. Such doublets composed of a collecting biconvex lens and a diverging meniscus have a positive effect on the correction state and can counteract the aberrations which are introduced by lenses with a strong, positive diffracting power downstream of the system aperture. It can be favorable, moreover, to arrange in the object-side entry region of the fourth lens group at least one meniscus lens, concave towards the object, with a positive refracting power, in order to collect the radiation coming from the waist in conjunction with a low areal stress.

In order to achieve very high numerical apertures, it is advantageous when the fifth lens group has exclusively positive lenses. It is possible, for example, to arrange four or more positive lenses between aperture stop and image plane. In this case, favorable surface loads can be achieved whenever at least one meniscus lens, concave towards the image, with a positive refracting power is provided in the fifth lens group. In particular, two or more such lenses can be provided. The last optical element is preferably formed by a plano-convex lens which preferably has a spherical entry surface and a substantially flat exit surface. It is possible thereby, on the one hand, to achieve a good correction of spherical aberration and coma and, on the other hand, a substantially flat exit surface is favorable for immersion lithography. In preferred embodiments, the plano-convex lens is nonhemispherical, the center of the spherical surface lying outside the lens. Truncated hemispherical lenses of this type can yield a reduced sensitivity to fluctuations in the working distance.

By applying some or all of these design principles, success has been achieved in preferred embodiments which keep the surface loads of the lenses so low that despite an aperture of more than NA=0.9 or 1, incidence angles whose sine is greater than approximately 90% or even approximately 85% of the image-side numerical aperture do not occur at any of the optical surfaces, and this simplifies the coating of the lenses and the adjustment of the objective.

In preferred embodiments, all the lenses of the projection objective consist of the same material. For operating wavelengths of 193 nm, synthetic quartz glass and, for operating wavelengths of 157 nm, calcium fluoride can be used, for example, as material. The use of only one kind of material facilitates production and permits simple adaptation of the objective design to other wavelengths. It is also possible to combine a plurality of kinds of material in order, for example, to support the correction of chromatic aberrations. It is also possible to use other UV-transparent materials such as $BaF_2$, NaF, LiF, SrF, $MgF_2$ or the like.

In addition to the claims, the description and the drawings also disclose the preceding and further features, it being possible for the individual features to be implemented on their own or severally in the form of subcombinations in the case of embodiments of the invention and in other fields, and for them to constitute advantageous designs which can be protected per se. In the drawings:

DETAILED DESCRIPTION OF THE PREFERRED EMBODIMENTS

In the following description of preferred embodiments, the term "optical axis" denotes a straight line through the centers of curvature of the optical components. Directions and distances are described as on the image side or towards the image when they are aligned in the direction of the image plane or the substrate, which is to be exposed, located there, and as on the object side or towards the object when they are directed towards the object with reference to the optical axis. In the examples, the object is a mask (reticle) with the pattern of an integrated circuit, but it can also be another pattern, for example a grating. In the examples, the image is formed on a wafer which serves as a substrate and is provided with a photoresist layer, but other substrates are also possible for example elements for liquid crystal displays or substrates for optical gratings. The focal lengths specified are focal lengths with reference to air.

Identical or mutually corresponding features of the various embodiments are denoted below with the same reference symbols for reasons of clarity.

Figure 1:
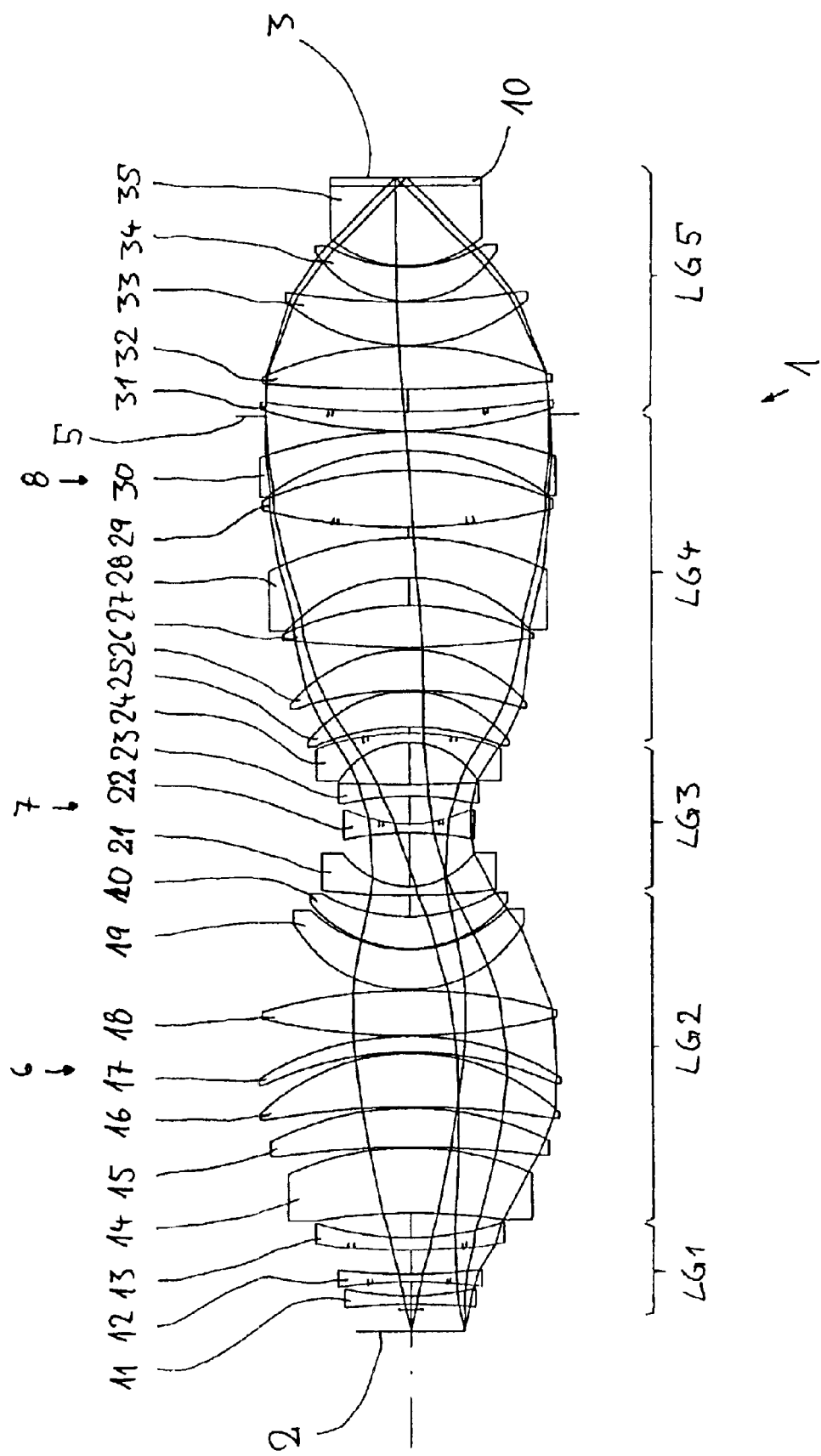
FIG. 1 shows a lens section through a first embodiment of a refractive projection objective which is designed for a 193 nm operating wavelength.

A typical design of an embodiment of a purely refractive reduction objective 1 according to the invention is shown with the aid of FIG. 1. It serves the purpose of projecting in conjunction with virtually homogeneous immersion a pattern, arranged in an object plane 2, of a reticle or the like into an image plane 3 to a reduced scale, for example to the scale of 5:1. This is a rotationally symmetrical single-waist system with five lens groups which are arranged along the optical axis 4, which is perpendicular to the object plane and image plane, and form an object-side belly 6, an image-side belly 8 and a waist 7 situated therebetween. The first lens group LG1, following the object plane 2, has a negative refracting power and a focal length of −166 mm. A second lens group LG2, following thereupon, has a positive refracting power with a focal length of 121 mm. A third lens group LG3, following thereupon, has a negative refracting power and a focal length of −33 mm. A fourth lens group LG4, following thereupon, has a positive refracting power with a focal length of 166 mm, which therefore corresponds in terms of magnitude to the focal length of the first lens group. A fifth lens group LG5, following thereupon, has a positive refracting power and a focal length of 170 mm, which is of the order of magnitude of the focal length of the fourth lens group and of the first lens group LG1 in terms of magnitude. The system aperture 5 is arranged between the fourth lens group LG4 and the fifth lens group LG5 in the region, near the image, of maximum beam diameter, that is to say in the second belly 8 of the objective.

The first lens group LG1, following the object plane 2, is substantially responsible for the expansion of the light bundle into the first belly 6. It comprises three lenses 11, 12, 13 with a negative refracting power, the first lens 11 and the second lens 12 being configured as biconvex negative lenses. The third lens 13 is a diverging meniscus in the case of which as a special feature the concave side is directed not towards the object 2 but towards the image plane 3. This arrangement is very favorable for correcting the tangential astigmatism. Otherwise, the first lens group includes two aspherics, specifically the entry sides of the second and the third lens. The aspherics have a positive influence on the very good correction of the distortion and the astigmatism.

The second lens group LG2 comprises four collecting menisci 14, 15, 16, 17, facing the reticle or the object plane 2 with their concave side, a biconvex positive lens 18 and two collecting menisci 19, 20 facing the wafer or the image plane 3 with their concave side. This design, in which the curvatures of the meniscus surfaces run on the object side and image side of the biconvex lens 18 in opposite directions with concave surfaces averted from one another, ensures small areal stresses for the menisci and the positive lens 18, and thus few aberrations. The biconcave air lens between the biconvex positive lens 18 and the following meniscus lens 19 has with its strong astigmatic undercorrection a favorable influence on the balancing-out of the astigmatism in the front part of the system upstream of the waist 7.

The third lens group LG3 consists exclusively of diverging lenses, specifically a negative meniscus lens 21 with image-side concave surfaces, a biconcave negative lens 22, following thereupon, a further biconcave negative lens, following thereupon, and a negative meniscus lens 24, following thereupon, with object-side concave surfaces. With reference to a plane of symmetry 9 lying between the lenses 22 and 23, these four lenses are designed with mirror symmetry with regard to lens type (meniscus lens or biconcave lens) and direction of curvature of the optical surfaces. Together with the last two lenses 19, 20 of the second lens group and the first two lenses 25, 26 of the fourth lens group LG4, following thereupon, there is a series of two collecting menisci 19, 20 and one diverging meniscus 21, all three of which have concave surfaces facing the waist or the plane of symmetry 9. In the opposite, mirrored direction, that is to say on the image side of the plane of symmetry 9, the two biconcave negative lenses 22, 23 are again followed at the waist, that is to say in the area of smallest diameter, by a diverging meniscus 24 and two collecting menisci 25, 26 of the fourth lens group. This design having mirror symmetry relative to the plane of symmetry 9 supports a low tensioning or a low areal stress of the optical surfaces, and thus few aberrations.

The third lens group includes, in the form of the exit surface of the smallest lens 22 and the exit surface of the negative meniscus lens 24, two aspherics which make a substantial contribution to the correction of the coma and the astigmatism.

The fourth lens group LG4 comprises on its entry side two positive meniscus lenses 25, 26 which are concave relative to the object plane and are followed by two doublets 27, 28 and 29, 30. Each of the doublets has, on the object side, a collecting biconvex lens 27 and 29, respectively, and downstream thereof a diverging meniscus 28 and 30, respectively, whose concave surfaces point towards the object plane. The two spherically strongly overcorrected, diverging menisci 28 (f'=−728 mm) and 30 (f'=−981 mm) counteract the strongly undercorrected, collecting lenses of the fifth lens group LG5 following downstream of the system aperture 5. The combination of the collecting biconvex lens and the diverging meniscus inside a doublet has a very positive effect on the correction of image errors in the region of the second belly 8. With their strong overcorrection of the tangential astigmatism, the two menisci 28, 30, in particular the thick meniscus 28, counteract the undercorrection in the fifth lens group LG5.

The fifth lens group LG5, situated downstream of the system aperture 5, is substantially responsible for producing the high numerical aperture. Provided for this purpose are exclusively collecting lenses, specifically a positive meniscus lens 31, arranged in the region of the system aperture 5, with surfaces concave towards the image, a biconvex positive lens 32, following thereupon, with a slightly curved entry side and a more strongly curved exit side, a positive meniscus lens 23, following thereupon, with surfaces concave towards the image, a further positive meniscus lens 24, likewise with surfaces concave towards the image, and a terminating plano-convex lens 35 with a spherical entry side and a flat exit side. The positive lenses 31, 32, 33 and 34 are strongly undercorrected spherically and overcorrected with reference to the coma. In the case of this design, the correction of the spherical aberration and the coma is therefore implemented substantially in conjunction with the configuration of the fourth lens group LG4 which is situated upstream of the system aperture 5 and creates a corresponding offset of these aberrations. Consequently, the fourth lens group LG4 and the fifth lens group LG5 are responsible in combination for achieving a good correction state of the spherical aberration and of coma. An aspheric surface on the entry side of the biconvex lens 27 of the first doublet substantially supports the correction of the spherical aberration, but also of the coma of third order. An aspheric surface, arranged in the vicinity of the system aperture 5, on the exit side of the positive meniscus lens 31, convex towards the object, at the input of the fifth lens group LG5 chiefly corrects aberrations of higher order and thereby makes a substantial contribution to setting a good aberration compromise. A likewise positive influence on the correction of aperture aberration and coma is exerted by the spherical, convex entry surface of the plano-convex lens 35. The latter is spherically overcorrected and undercorrected with reference to coma.

The system has a working distance on the image side of approximately 8.4 mm, which can be filled up by an immersion fluid 10. De-ionized water (refractive index n=1.47) or another suitable transparent liquid, for example, can be used at 193 nm as immersion fluid.

The correction state of the optical system 1 is excellent. All aberrations are corrected. The RMS value of the wavefront deformation is very low at 4 mλ. The distortion of all field points in the region is below 1 nm. A projection objective is thus created which operates at an operating wavelength of 193 nm, can be produced with the aid of conventional techniques for lens production and coating, and permits a resolution of structures substantially below 100 nm.

The design described is fundamentally suitable for near-field lithography, as well, by the use of a homogeneous immersion. For this purpose, the terminating plano-convex lens 35 is to be combined with the immersion layer 10 to form a lens which can consist, for example, of synthetic quartz glass. In order to permit sufficient light energy of the evanescent field to be coupled in, in this case the working distance between the exit surface of the projection objective and the image plane should be in the region of 100 nm or below.

The specification of the design is summarized in a known way in tabular form in Table 1. Here, column 1 gives the number of a refracting surface, or one distinguished in another way, column 2 gives the radius r of the surface (in mm), column 3 gives the distance d denoted as thickness, of the surface from the following surface (in mm), column 4 gives the material of the optical components, and column 5 gives the refractive index of the material of the component, which follows the entry surface. The useful, free radii or half the free diameter of the lenses (in mm) are specified in column 6.

In the case of the embodiment, six of the surfaces, specifically the surfaces 4, 6, 15, 29, 34 and 44, are aspheric. Table 2 specifies the corresponding aspheric data, the aspheric surfaces being calculated using the following rule:

$$p(h)=[((1/r)h^2)/(1+SQRT(1-(1+K)(1/r)^2h^2))]+C1*h^4+C2*h^6+ \ldots$$

Here, the reciprocal (1/r) of the radius specifies the surface curvature, and h the distance of a surface point from the optical axis. Consequently, p(h) gives the so-called sagitta, that is to say the distance of the surface point from the surface apex in the z direction, that is to say in the direction of the optical axis. The constants K, C1, C2, . . . are reproduced in Table 2.

The optical system 1, which can be reproduced with the aid of these data, is designed for an operating wavelength of approximately 193 nm, for which the synthetic quartz glass used for all the lenses has a refractive index n=1.56029. The image-side numerical aperture is 1.1. The system is adapted to a refractive index of the immersion medium 10 of n=1.56, which permits a virtually ideal coupling of the light into the immersion layer 10. The objective has an overall length (distance between image plane and object plane) of 1162 mm. A light conductance (product of numerical aperture and image size, also denoted étendue or geometrical flux) of 24.1 mm is achieved given an image size of 22 mm.

Figure 2:
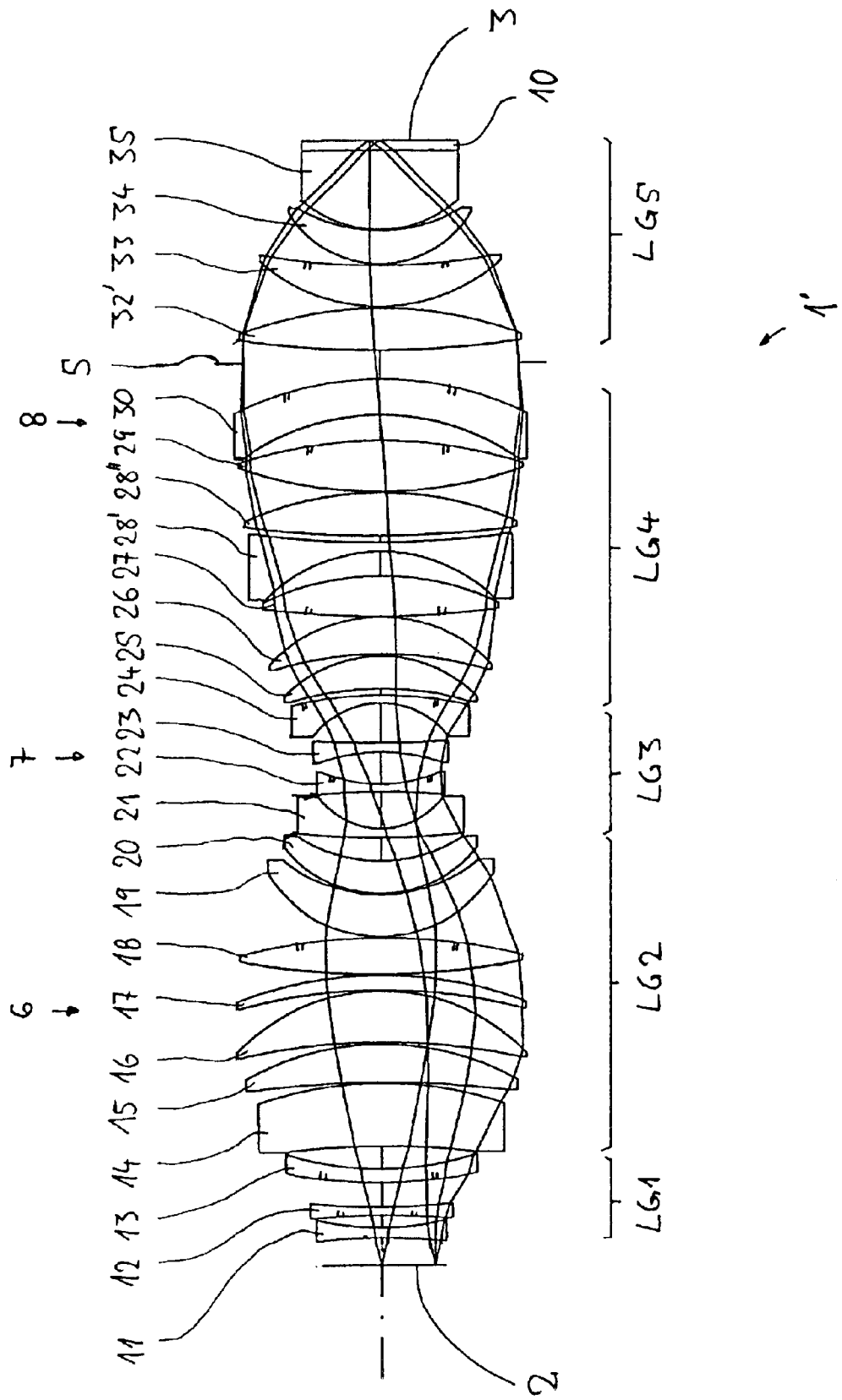
FIG. 2 shows a lens section through a second embodiment of a projection objective which is designed for a 193 nm operating wavelength.

A variant of the projection objective shown in FIG. 1 is explained with the aid of FIG. 2. Lenses or lens groups of the same type or the same function are denoted by the same reference symbols for reasons of clarity. The system 1' is optimized for a refractive index of the immersion medium of n=1.37, and this corresponds to a value, which has become known from the literature, of 157 nm for the refractive index of an immersion fluid based on perfluoropolyether (PFPE).

The fourth and the fifth lens group differ in terms of design from that in accordance with FIG. 1. In LG4, the thick meniscus lens 28 of the first doublet in FIG. 1 is split up into an object-side, biconcave negative lens 28' with an only slightly curved exit side and a subsequent biconvex positive lens 28'' with a correspondingly only slightly curved entry side. This splitting-up further reduces the areal stress of the optical surfaces in this region. The rim ray of the projection runs in a converging fashion in the air space between the subsequent lenses 29, 30 upstream of the entry surface of the meniscus 30 which is concave towards the object. In the fifth lens group LG5, the entry-side lenses 31, 32, separated in the case of the design in FIG. 1 and downstream of the system aperture 5 are combined to form a single, biconvex positive lens 32'. This is situated at a distance downstream of the system aperture 5, which can be accessed particularly easily. A further special feature consists in that the system aperture 5 is situated between a plane, near the image, of maximum beam diameter and the image plane 3, that is to say where the trans-illuminated diameter of the lenses already decreases towards the image plane. The other lenses correspond with regard to the type and sequence of the lenses of identical reference symbols in FIG. 1. In the case of this design, as well, all the lenses consist of synthetic quartz glass. The specification of this design in the notation described is specified in Tables 3 and 4.

Figure 3:
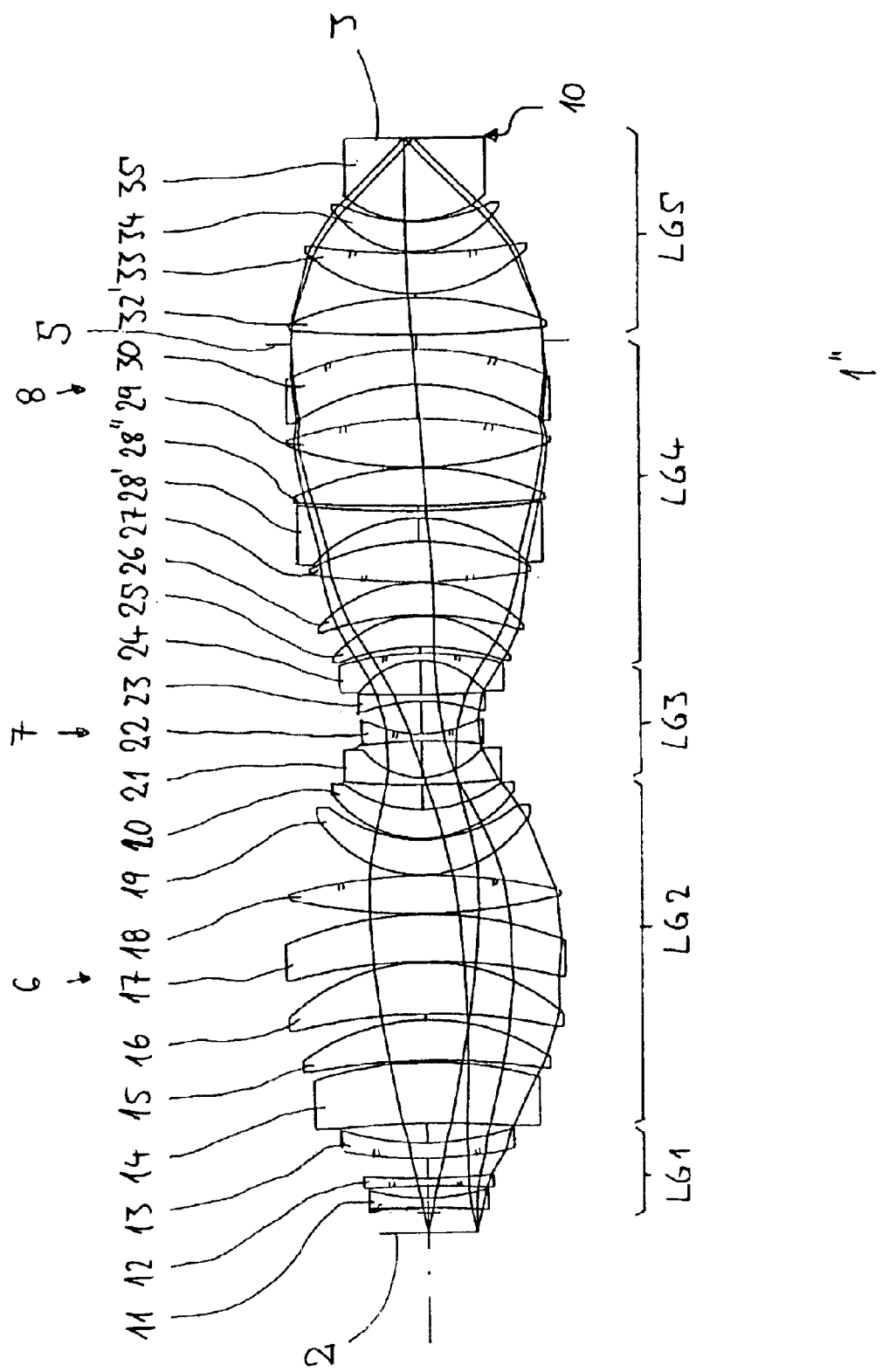
FIG. 3 shows a lens section through a third embodiment of a projection objective which is designed for a 157 nm operating wavelength.

Shown in FIG. 3 is a third embodiment, designed for an operating wavelength of 157 nm, of a projection objective 1'' whose specification is given in Tables 5 and 6. It is to be seen from the sequence and the type of lenses that the design is based on the design principle explained with the aid of FIGS. 1 and 2, and so the same reference symbols are used for lenses and lens groups with corresponding functions. As in the case of the embodiment in accordance with FIG. 1, no further optical element is arranged upstream of the first biconcave negative lenses 11 of the objective. As in the case of the embodiment in accordance with FIG. 2, in the fourth lens group LG4 the thick meniscus lens 28, still in one piece in FIG. 1, is split up into a biconcave negative lens 28' and a directly following biconvex positive lens 28''. Just as in the case of the embodiment in accordance with FIG. 2, the function of the entry-side lenses 31, 32 of the embodiment in accordance with FIG. 1 is taken over by a single, biconvex positive lens 32' which initiates the ray combination towards the image plane. In a way similar to the case of the embodiment in accordance with FIG. 2, the system aperture 5 is situated inside the second belly 8 downstream of the region of maximum beam diameter, that is to say where the beam diameter already decreases again towards the image plane.

The refractive index for the immersion medium is set at n=1.37, which corresponds to a value, which has become known from the literature, for a PFPE-based immersion fluid sufficiently transparent at 157 nm. The image-side working distance is set to approximately 50 μm, which corresponds in practical use to the thickness of the immersion layer. It may be assumed that suitable immersion fluids still have high transmission values of more than 90% in the case of this low thickness, and so only negligible, low transmission losses occur in the region of the immersion, this being favorable for achieving a satisfactory wafer throughput. Pattern widths of less than 70 nm can be resolved with the aid of this purely refractive projection objective, of excellent correction state, which can be implemented using conventional means.

Tables 7 and 8 show the specification of an embodiment (not illustrated pictorially) of a projection objective which is derived from the embodiment in accordance with FIG. 3, from which it differs essentially in that the thick meniscus lens 17, concave towards the object, there is replaced by a thinner meniscus lens curved in the same direction. A comparison of Tables 5 and 6 shows that as a result an even more compact design is possible which has smaller lens diameters and a smaller overall length in conjunction with equally good optical properties.

Figure 4:
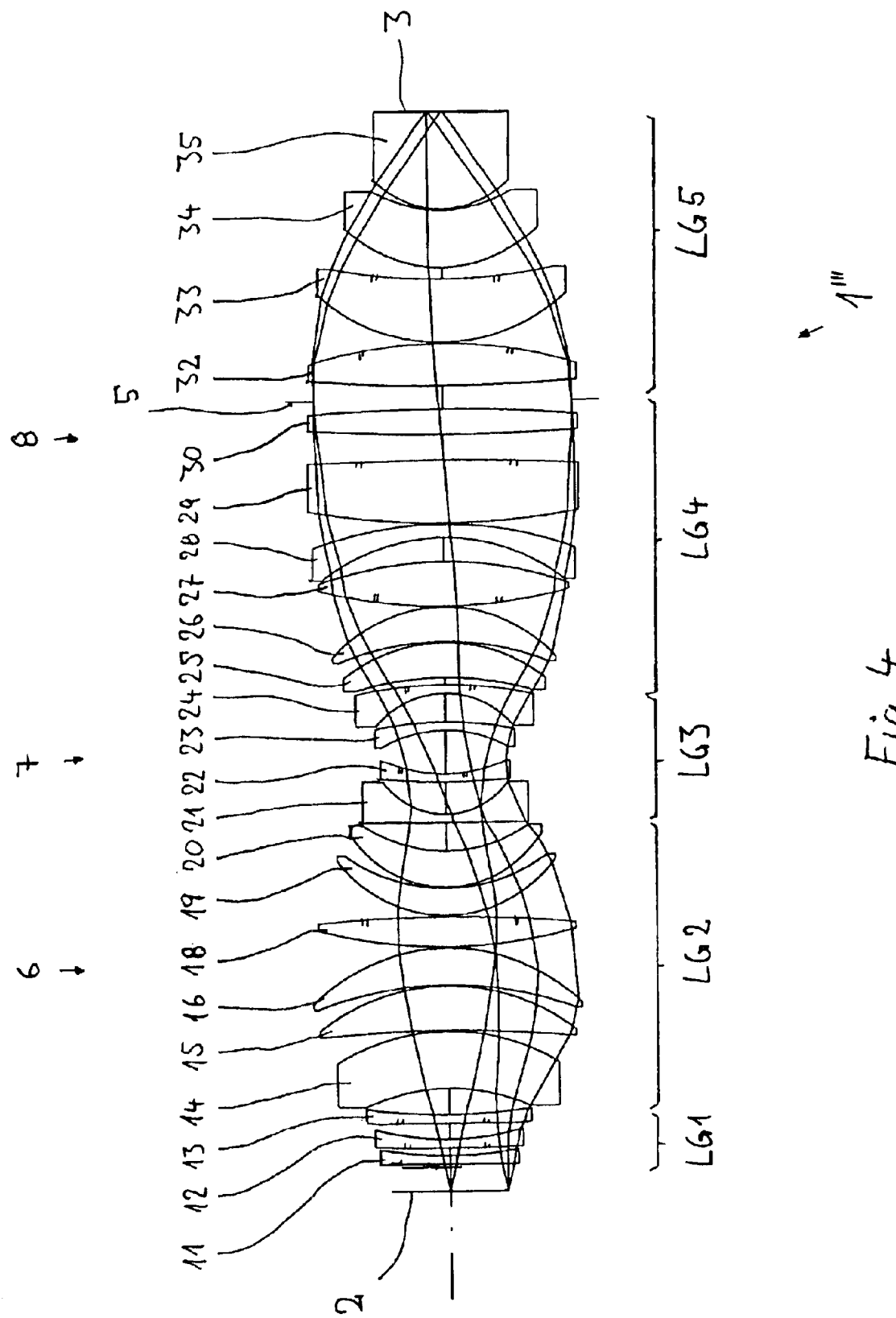
FIG. 4 shows a lens section through a fourth embodiment of a projection objective which is designed for a 193 nm operating wavelength.

A fourth embodiment of a projection objective 1''', which is designed for an operating wavelength of 193 nm and whose specification is given in Tables 9 and 10 is shown in FIG. 4. This embodiment has a projection scale of 4:1 and an image-side numerical aperture NA=0.9. A comparison with the remaining embodiments shows that less lens material is required in conjunction with the same fundamental optical principle. Instead of 25, as in the case of the other embodiments, there is a need for only 23 lenses, and moreover the average and maximum lens diameters are smaller than with the preceding embodiments. In particular, there is provision in the second lens group LG2 for only three menisci 14, 15, 16, concave towards the object, a lens corresponding to the menisci 17 of the other embodiments being absent. In contrast to the other embodiments, in the fourth lens group LG4 only one doublet 27 and 28 is provided, and so a saving of one lens is made in this lens group as well. The symmetrical design of the third lens group LG3 and of the lens pairs bordering thereon, 19, 20, of the second lens group and 25, 26 of the fourth lens group corresponds to that of the other embodiments. The embodiment in accordance with FIG. 4 substantiates that it is also possible to implement solutions of favorable design within the scope of the invention for relatively large projection scales and relatively large fields.

The correction state of all the embodiments shown is excellent. All aberrations are corrected. The maximum RMS value of the wavefront deformation is very low and is below 4.5 mλ for the embodiments in accordance with FIGS. 1 and 2, below 6.5 mλ for the embodiment in accordance with Tables 7 and 8, and below 5.2 mλ for the embodiment in accordance with FIG. 4. Within all the systems, the distortion is in the region below 1 nm for all field points.

It can be seen by the person skilled in the art from the examples that numerous modifications of the designs are possible within the scope of the invention. For example, individual lenses can be split up into two or more separate lenses, or separate lenses can be combined to form a single lens having essentially the same function.

Embodiments with two or more lens materials are also possible. For example, in the case of embodiments for 193 nm it is possible to provide a combination of lenses made from synthetic quartz glass and calcium fluoride in order to facilitate chromatic correction and in order to avoid changes in refractive index because of compaction in regions of high radiation energy densities by using calcium fluoride lenses. Also possible is the use of other materials transparent to the ultraviolet light used, such as barium fluoride, sodium fluoride, lithium fluoride, strontium fluoride, magnesium fluoride or the like.

Catadioptric systems for immersion lithography can also be designed using essential configuration features of the embodiments represented here, in particular in the region, near the image, of the second belly and the aperture stop.

The technical teaching of the invention explained with the aid of various exemplary embodiments shows that a range of design boundary conditions should be taken into account when the aim is to design an optical system suitable for immersion lithography, particularly one of such compact design. The following features can be beneficial individually or in combination. Immersion objectives for which the image field diameter is greater than approximately 1%, in particular greater than approximately 1.5% of the overall length are favorable. Favorable light conductances (product of image field diameter and numerical aperture) are in the region of above 1%, in particular above 2% of the overall length. Four or more collecting lenses between aperture stop and image plane are favorable, it being preferred for only collecting lenses to be provided in this region. Preferably more than four, five or six consecutive collecting lenses are favorable in the second lens group. In this case, preferably two or more collecting menisci with an object-side concave surface are favorable in the entry region of the second lens group, and two or more collecting menisci with surfaces concave towards the image are favorable at the end of the second lens group. In the region of the first belly or of the second lens group a strong beam expansion is beneficial for which the maximum beam diameter is preferably more than 1.8 times, in particular more than 2 times the object field diameter. The maximum lens diameter in the second lens group can be approximately twice the minimum free lens diameter of the third lens group in the region of the constriction. The maximum lens diameter in the second belly following the constriction is preferably of the same order of magnitude and can, in particular, be greater than twice the minimum free diameter in the third lens group. In the region of the third lens group, that is to say in the region of the waist of the system, two concave surfaces are preferably directly opposite one another and are enclosed by two surfaces curved in the same sense. The lenses respectively adjoining towards the object and towards the image are also preferably designed and arranged in this way.

Particular lens distributions can be favorable. In particular, it is favorable when substantially more lenses are situated upstream of the system aperture than downstream of the aperture. The number of lenses upstream of the aperture is preferably at least four times, in particular more than five times, the number of lenses downstream of the system aperture. Five or more collecting lenses are preferably arranged between the region of narrowest constriction and the system aperture or aperture stop; the axial distance between the region of narrowest constriction and the aperture stop arranged exceptionally near the image is favorably at least 26%, if appropriate more than 30% or 35%, of the overall length of the projection objectives.

Further special features relate to the trajectory of and the relationships between principal rays and rim rays of the projection. Denoted here as principal ray is a ray which runs from a rim point of the object field parallel or at an acute angle to the optical axis and which cuts the optical axis in the region of the system aperture. A rim ray in the sense of the present application leads from the middle of the object field to the rim of the aperture stop. The perpendicular distance of these rays from the optical axis yields the corresponding ray height. It can be favorable when the principle ray height is greater in absolute value up to the end of the second lens group than the rim ray height, this relationship preferably not being reversed until in the region of the third lens group. The maximum rim ray height is preferably more than twice, in particular more than 2.3 to 2.5 times, the rim ray height in the region of the narrowest constriction of the third lens group. It is favorable when the diameter of the rim ray is kept small in the region between the fourth and fifth lens groups, that is to say in the region of the system aperture. This corresponds to a smallest possible focal length of the fifth lens group, following the system aperture. The focal length of the fifth lens group is preferably smaller than 15%, in particular smaller than 10% of the overall length. Preferred systems are doubly telecentric, and so the principal ray is substantially perpendicular both to the object plane and to the image plane. In preferred systems, the principal ray coming from the object field should still have a divergent trajectory after at least five lenses, that is to say a trajectory with a still rising principal ray height away from the optical axis. It is favorable, furthermore, when the sine of the maximum principal ray divergence angle in the objective region near the object is more than 50% of the object-side numerical aperture. A plurality of aspheric surfaces are preferably provided in the region near the object in which the rim ray height is greater than the principal ray height, in order to promote a favorable correction state.

The invention also relates to a projection exposure machine for micro-lithography which is distinguished in that it includes a refractive projection objective in accordance with the invention. The projection exposure machine preferably also has devices intended for introducing and keeping an immersion medium, for example a liquid of suitable refractive index, between the last optical surface of the projection objective and the substrate to be exposed. Also covered is a method for producing semiconductor components and other finely structured structural elements, in the case of which an image of a pattern arranged in the object plane of a projection objective is projected in the region of the image plane, an immersion medium arranged between the projection objective and the substrate to be exposed and transparent to light at the operating wavelength being transilluminated.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

| SURFACE | RADII | THICKNESSES | LENSES | REFRACTIVE INDEX 193.304 nm | ½ FREE DIAMETER |
|---|---|---|---|---|---|
| 0 | 0.000000000 | 21.980160000 | | | 55.000 |
| 1 | 0.000000000 | 5.669665462 | | | 59.973 |
| 2 | −697.373131352 | 8.830738819 | SI02 | 1.56028900 | 60.658 |
| 3 | 317.877790816 | 13.366856184 | | | 63.806 |
| 4 | −389.517361474AS | 8.018967568 | SI02 | 1.56028900 | 65.103 |
| 5 | 684.978717634 | 23.693566944 | | | 70.051 |
| 6 | 612.579041806AS | 13.565039007 | SI02 | 1.56028900 | 86.338 |
| 7 | 315.238108546 | 24.050777166 | | | 92.585 |
| 8 | −636.903175512 | 64.776862854 | SI02 | 1.56028900 | 95.153 |
| 9 | −304.036729565 | 1.000000000 | | | 120.585 |
| 10 | −942.407223581 | 39.153776761 | SI02 | 1.56028900 | 130.798 |
| 11 | −317.623154272 | 1.332033169 | | | 137.817 |
| 12 | −856.579360710 | 53.698176363 | SI02 | 1.56028900 | 145.587 |
| 13 | −222.120764338 | 1.000000000 | | | 148.413 |
| 14 | −365.979641333 | 16.565547178 | SI02 | 1.56028900 | 148.696 |
| 15 | −300.375347712 | 1.000000000 | | | 150.000 |
| 16 | 622.472470310 | 44.791302453 | SI02 | 1.56028900 | 146.389 |
| 17 | −556.306013695 | 1.020913522 | | | 145.384 |
| 18 | 135.290972565 | 40.672419816 | SI02 | 1.56028900 | 113.552 |
| 19 | 140.238400611 | 1.007703555 | | | 99.382 |
| 20 | 128.146489274 | 33.605830320 | SI02 | 1.56028900 | 97.047 |
| 21 | 178.381821741 | 21.367336106 | | | 87.913 |
| 22 | 764.210626300 | 8.040530767 | SI02 | 1.56028900 | 85.346 |
| 23 | 81.619567541 | 55.111180427 | | | 66.098 |
| 24 | −324.577506735 | 8.010204876 | SI02 | 1.56028900 | 63.499 |
| 25 | 133.065440504AS | 29.116630876 | | | 62.507 |
| 26 | −275.984572757 | 12.121405585 | SI02 | 1.56028900 | 63.961 |
| 27 | 2685.503343355 | 41.843073620 | | | 68.171 |
| 28 | −83.024363434 | 9.316662930 | SI02 | 1.56028900 | 69.398 |
| 29 | −271.500870518AS | 7.122879020 | | | 90.369 |
| 30 | −234.082616820 | 34.813633391 | SI02 | 1.56028900 | 93.111 |
| 31 | −128.67921398 | 1.375380851 | | | 98.648 |
| 32 | −371.070689222 | 40.964768288 | SI02 | 1.56028900 | 112.720 |
| 33 | −158.555144143 | 2.142646331 | | | 116.033 |
| 34 | 844.565103125AS | 42.656894678 | SI02 | 1.56028900 | 123.022 |
| 35 | −293.770426726 | 28.164927093 | | | 123.344 |
| 36 | −170.081620687 | 40.277028630 | SI02 | 1.56028900 | 122.713 |
| 37 | −316.315520485 | 10.963607028 | | | 137.139 |
| 38 | 623.625571533 | 56.758798505 | SI02 | 1.56028900 | 143.361 |
| 39 | −379.372716473 | 20.156323351 | | | 143.139 |
| 40 | −246.931005408 | 18.567257168 | SI02 | 1.56028900 | 142.262 |
| 41 | −460.148730828 | 16.465394474 | | | 145.978 |
| 42 | 0.000000000 | −15.465394474 | | | 144.329 |
| 43 | 506.946830874 | 18.875460558 | SI02 | 1.56028900 | 144.915 |
| 44 | 1011.956468931AS | 22.938981004 | | | 144.124 |
| 45 | 1760.701259607 | 42.739861927 | SI02 | 1.56028900 | 143.914 |
| 46 | −171.926449461 | 1.3613972772 | | | 143.620 |
| 47 | 194.244261542 | 42.532993341 | SI02 | 1.56028900 | 120.019 |
| 48 | 689.962205932 | 1.126753967 | | | 114.927 |
| 49 | 109.590774593 | 34.378356865 | SI02 | 1.56028900 | 88.972 |
| 50 | 156.823775540 | 1.072372528 | | | 79.549 |
| 51 | 118.692607648 | 60.000000000 | SI02 | 1.56028900 | 73.749 |
| 52 | 0.000000000 | 8.436241391 | Immersion | 1.56000000 | 19.439 |
| 53 | 0.000000000 | 0.000000000 | | | 11.000 |

TABLE 2

ASPHERIC CONSTANTS

SURFACE NO. 4

| | |
|---|---|
| K | 0.0000 |
| C1 | 2.13047921e−007 |
| C2 | −3.57933301e−011 |
| C3 | 2.93263063e−015 |
| C4 | −4.61461071e−019 |
| C5 | 2.76861570e−023 |
| C6 | 1.62740830e−027 |
| C7 | −3.43732853e−031 |
| C8 | 0.00000000e+000 |
| C9 | 0.00000000e+000 |

TABLE 2-continued

ASPHERIC CONSTANTS

SURFACE NO. 6

| | |
|---|---|
| K | 0.0000 |
| C1 | −1.14265623e−007 |
| C2 | 2.02166625e−011 |
| C3 | −1.76403105e−015 |
| C4 | 2.36305340e−019 |
| C5 | −2.55314839e−023 |
| C6 | 1.35459868e−027 |
| C7 | −2.70730236e−032 |
| C8 | 0.00000000e+000 |
| C9 | 0.00000000e+000 |

TABLE 2-continued

ASPHERIC CONSTANTS

SURFACE NO. 25

| | |
|---|---|
| K | 0.0000 |
| C1 | -9.78914413e-008 |
| C2 | -4.33168283e-012 |
| C3 | -8.01001563e-017 |
| C4 | -1.31611936e-019 |
| C5 | 6.54375176e-023 |
| C6 | -1.37293557e-026 |
| C7 | 1.58764578e-030 |
| C8 | 0.00000000e+000 |
| C9 | 0.00000000e+000 |

SURFACE NO. 29

| | |
|---|---|
| K | 0.0000 |
| C1 | 2.99497807e-008 |
| C2 | -3.16131943e-012 |
| C3 | -9.61008384e-017 |
| C4 | 2.05647555e-020 |
| C5 | -2.56167018e-024 |
| C6 | 1.74321022e-028 |
| C7 | -7.59802684e-033 |
| C8 | 0.00000000e+000 |
| C9 | 0.00000000e+000 |

TABLE 2-continued

ASPHERIC CONSTANTS

SURFACE NO. 34

| | |
|---|---|
| K | 0.0000 |
| C1 | -5.83593306e-009 |
| C2 | -4.08253893e-015 |
| C3 | -3.40922951e-018 |
| C4 | 1.36466433e-022 |
| C5 | -1.03090955e-026 |
| C6 | 4.02018916e-031 |
| C7 | -9.89543799e-036 |
| C8 | 0.00000000e-000 |
| C9 | 0.00000000e-000 |

SURFACE NO. 44

| | |
|---|---|
| K | 0.0000 |
| C1 | -5.18910040e-009 |
| C2 | 3.51025484e-013 |
| C3 | -5.47716488e-018 |
| C4 | 4.43561455e-023 |
| C5 | 3.42844064e-028 |
| C6 | -1.97724021e-032 |
| C7 | 2.22456117e-037 |
| C8 | 0.00000000e+000 |
| C9 | 0.00000000e+000 |

TABLE 3

| SURFACE | RADII | THICKNESSES | LENSES | REFRACTIVE INDEX ???.?? nm | ½ FREE DIAMETER |
|---|---|---|---|---|---|
| 0 | 0.000000000 | 21.960160000 | L710 | 0.99998200 | 55.000 |
| 1 | 0.000000000 | 6.228362492 | L710 | 0.99998200 | 59.974 |
| 2 | -603.070624671 | 9.913063455 | SI02HL | 1.56028900 | 60.690 |
| 3 | 280.916333783 | 13.300217883 | HE193 | 0.99971200 | 64.385 |
| 4 | -461.660931347AS | 8.000000000 | SI02HL | 1.56028900 | 65.798 |
| 5 | 681.261406487 | 25.180533824 | HE193 | 0.99971200 | 70.487 |
| 6 | 421.796712825AS | 13.410028997 | SI02HL | 1.56028900 | 89.920 |
| 7 | 306.236502978 | 23.641854301 | HE193 | 0.99971200 | 95.293 |
| 8 | -881.74305988 | 64.144962259 | SI02HL | 1.56028900 | 97.777 |
| 9 | -397.616228767 | 1.632715830 | HE193 | 0.99971200 | 123.195 |
| 10 | -1049.995266970 | 39.473283137 | SI02HL | 1.56028900 | 130.947 |
| 11 | -286.549348161 | 2.251083978 | HE193 | 0.99971200 | 136.447 |
| 12 | -659.273684770 | 52.089256568 | SI02HL | 1.56028900 | 143.894 |
| 13 | -209.207390137 | 1.008491553 | HE193 | 0.99971200 | 146.415 |
| 14 | -565.795559961 | 15.829681399 | SI02HL | 1.56028900 | 145.408 |
| 15 | -410.848668817 | 1.000000613 | HE193 | 0.99971200 | 146.045 |
| 16 | 809.207497255 | 37.599045382 | SI02HL | 1.56028900 | 142.424 |
| 17 | -599.260287529AS | 1.00000015 | HE193 | 0.99971200 | 141.453 |
| 18 | 136.304287826 | 42.528385200 | SI02HL | 1.56028900 | 113.454 |
| 19 | 157.516637917 | 1.000000000 | HE193 | 0.99971200 | 101.084 |
| 20 | 126.013978931 | 34.051407776 | SI02HL | 1.56028900 | 96.007 |
| 21 | 157.519818688 | 23.594259229 | HE193 | 0.99971200 | 84.914 |
| 22 | 795.455608357 | 9.039828932 | SI02HL | 1.56028900 | 82.369 |
| 23 | 78.918295718 | 38.235934318 | HE193 | 0.99971200 | 63.551 |
| 24 | -647.136797738 | 8.000000184 | SI02HL | 1.56028900 | 63.056 |
| 25 | 148.158813477AS | 32.440106724 | HE193 | 0.99971200 | 61.484 |
| 26 | -187.858636028 | 9.960377452 | SI02HL | 1.56028900 | 62.472 |
| 27 | 1367.448704100 | 41.007582498 | HE193 | 0.99971200 | 66.716 |

TABLE 3-continued

| SURFACE | RADII | THICKNESSES | LENSES | REFRACTIVE INDEX ???.?? nm | ½ FREE DIAMETER |
|---|---|---|---|---|---|
| 28 | -87.255013445 | 8.475217865 | SI02HL | 1.56028900 | 68.713 |
| 29 | -396.760639119AS | 6.473681900 | HE193 | 0.99971200 | 88.202 |
| 30 | -317.095597644 | 34.300021646 | SI02HL | 1.56028900 | 90.935 |
| 31 | -136.816156215 | 1.956487291 | HE193 | 0.99971200 | 96.054 |
| 32 | -384.621022314 | 38.2508591268 | SI02HL | 1.56028900 | 107.862 |
| 33 | -158.063116797 | 1.000000006 | HI193 | 0.99971200 | 111.057 |
| 34 | 807.690134078AS | 41.456271568 | SI02HL | 1.56028900 | 117.589 |
| 35 | -280.885163902 | 25.3545810908 | HI193 | 0.99971200 | 117.901 |
| 36 | -166.502630134 | 9.238823967 | SI02HL | 1.56028900 | 117.263 |
| 37 | 988.468038668 | 6.683211723 | HE193 | 0.99971200 | 131.802 |
| 38 | 1106.583200370 | 44.055972378 | SI02HL | 1.56028900 | 134.587 |
| 39 | -353.437766566 | 1.000000005 | HE193 | 0.99971200 | 136.483 |
| 40 | 445.824457242 | 52.624318854 | SI02HL | 1.56028900 | 142.739 |
| 41 | -460.556866224AS | 26.188809880 | HE193 | 0.99971200 | 142.372 |
| 42 | -248.318425801 | 36.706472180 | SI02HL | 1.56028900 | 141.622 |
| 43 | -340.049722714AS | 16.332593082 | HE193 | 0.99971200 | 146.673 |
| 44 | 0.000000000 | 12.926710616 | HE193 | 0.99971200 | 142.237 |
| 45 | 1026.963905660 | 42.807368082 | SI02HL | 1.56028900 | 142.523 |
| 46 | -417.465602619 | 1.875432853 | HL193 | 0.99971200 | 142.184 |
| 47 | 189.031074062 | 41.089218814 | SI02HL | 1.56028900 | 121.251 |
| 48 | 698.095904580AS | 1.076370948 | HE193 | 0.99971200 | 117.434 |
| 49 | 109.988479121 | 34.053123871 | SI02HL | 3.56028900 | 91.356 |
| 50 | 167.347263939 | 1.034746212 | HL193 | 0.99971200 | 84.177 |
| 51 | 123.915863411 | 79.999373259 | SI02HL | 1.56028900 | 77.713 |
| 52 | 0.000000000 | 10.366030727 | IMMERS | 1.37000000 | 25.089 |
| 53 | 0.000000000 | 0.000000000 |  | 1.00000000 | 11.000 |

TABLE 4

ASPHERIC CONSTANTS

SURFACE NO. 4

| K | 0.0000 |
|---|---|
| C1 | 2.26522214e-007 |
| C2 | -3.59236651e-011 |
| C3 | 2.92133725e-015 |
| C4 | -3.77696824e-019 |
| C5 | 7.96388858e-024 |
| C6 | 3.91988385e-027 |
| C7 | -4.54711324e-031 |
| C8 | 0.00000000e+000 |
| C9 | 0.00000000e+000 |

SURFACE NO. 6

| K | 0.0000 |
|---|---|
| C1 | -1.19063117e-007 |
| C2 | 1.94138266e-011 |
| C3 | -1.81962009e-015 |
| C4 | 2.25193097e-019 |
| C5 | -2.25566558e-023 |
| C6 | 1.19237134e-027 |
| C7 | -2.51584924e-032 |
| C8 | 0.00000000e+000 |
| C9 | 0.00000000e+000 |

SURFACE NO. 17

| K | 0.0000 |
|---|---|
| C1 | 1.74375723e-011 |
| C2 | -2.04139734e-014 |
| C3 | 7.67666306e-019 |
| C4 | -1.93715606e-023 |
| C5 | 1.92834024e-027 |
| C6 | -7.02565837e-032 |
| C7 | 1.14576119e-036 |
| C8 | 0.00000000e-000 |
| C9 | 0.00000000e-000 |

SURFACE NO. 25

| K | 0.0000 |
|---|---|
| C1 | -6.99705361e-008 |
| C2 | -3.25537639e-012 |

TABLE 4-continued

ASPHERIC CONSTANTS

| C3 | -2.93013408e-016 |
|---|---|
| C4 | -9.17751598e-020 |
| C5 | 4.34261555e-023 |
| C6 | -1.01901896e-026 |
| C7 | 1.42841266e-030 |
| C8 | 0.00000000e+000 |
| C9 | 0.00000000e+000 |

SURFACE NO. 29

| K | 0.0000 |
|---|---|
| C1 | 3.01668174e-008 |
| C2 | -4.16186211e-012 |
| C2 | -2.10017649e-017 |
| C4 | 1.39690646e-020 |
| C5 | -1.51163159e-024 |
| C6 | 6.56920089e-029 |
| C7 | -3.15414270e-033 |
| C8 | 0.00000000e+000 |
| C9 | 0.00000000e+000 |

SURFACE NO. 34

| K | 0.0000 |
|---|---|
| C1 | -4.23631017e-009 |
| C2 | -3.29710303e-014 |
| C3 | -3.52756803e-018 |
| C3 | -3.52756803e-018 |
| C4 | -4.13266120e-023 |
| C5 | -2.18653880e-027 |
| C6 | 2.27691141e-031 |
| C7 | -8.70596013e-036 |
| C8 | 0.00000000e+000 |
| C9 | 0.00000000e+000 |

TABLE 4-continued

ASPHERIC CONSTANTS

SURFACE NO. 41

| | |
|---|---|
| K | 0.0000 |
| C1 | 3.45855942e−009 |
| C2 | 5.47566277e−014 |
| C3 | −3.85610770e−018 |
| C4 | 2.74041138e−023 |
| C5 | 1.86632362e−027 |
| C6 | −3.44742394e−032 |
| C7 | 3.29571792e−038 |
| C8 | 0.00000000e−000 |
| C9 | 0.00000000e−000 |

SURFACE NO. 43

| | |
|---|---|
| K | 0.0000 |
| C1 | −3.55873802e−010 |
| C2 | 9.63322458e−014 |
| C3 | −7.64415866e−019 |
| C4 | 2.00153471e−023 |
| C5 | −1.98329358e−027 |
| C6 | 5.52524526e−032 |
| C7 | −4.80876507e−037 |
| C8 | 0.00000000e+000 |
| C9 | 0.00000000e+000 |

TABLE 4-continued

ASPHERIC CONSTANTS

SURFACE NO. 48

| | |
|---|---|
| K | 0.0000 |
| C1 | −2.25289484e−009 |
| C2 | 2.62711822e−013 |
| C3 | 3.12883195e−018 |
| C4 | −2.96009757e−022 |
| C5 | 1.93969203e−026 |
| C6 | −7.02702044e−031 |
| C7 | 1.40339412e−035 |
| C8 | 0.00000000e+000 |
| C9 | 0.00000000e+00 |

TABLE 5

| SURFACE | RADII | THICKNESS | LENSES | REFRACTIVE INDEX ???.?? nm | ½ FREE DIAMETER |
|---|---|---|---|---|---|
| 0 | 0.000000000 | 21.560160000 | L710 | 1.00000000 | 55.000 |
| 1 | 0.000000000 | 5.621199992 | L710 | 1.00000000 | 59.973 |
| 2 | −653.380153342 | 10.709637537 | CAF2HL | 1.55848720 | 60.652 |
| 3 | 234.866815378 | 14.192447066 | HE193 | 1.00000000 | 64.672 |
| 4 | −541.443785623AS | 8.069018137 | CAF2HL | 1.55848720 | 66.216 |
| 5 | 805.887192810 | 22.060952617 | HE193 | 1.00000000 | 70.663 |
| 6 | 437.017712375AS | 16.925405940 | CAF2HL | 1.55848720 | 88.269 |
| 7 | 315.047933823 | 22.322216303 | HE193 | 1.00000000 | 94.661 |
| 8 | −1055.166104070 | 68.241607282 | CAF2HL | 1.55848720 | 97.341 |
| 9 | −440.417777767 | 1.950157109 | HE193 | 1.00000000 | 124.495 |
| 10 | −833.235756565 | 45.202998015 | CAF2HL | 1.55848720 | 130.520 |
| 11 | −248.097167968 | 6.967867993 | HE193 | 1.00000000 | 136.785 |
| 12 | −667.629333865 | 58.527118374 | CAF2HL | 1.55848720 | 147.021 |
| 13 | −230.265801432 | 1.000000000 | HE193 | 1.00000000 | 152.069 |
| 14 | −635.989091493 | 52.889533957 | CAF2HL | 1.55848720 | 151.782 |
| 15 | −420.879980530 | 1.0000000000 | HE193 | 1.00000000 | 155.231 |
| 16 | 682.574050518 | 42.965469096 | CAF2HL | 1.55848720 | 150.819 |
| 17 | −650.602325928AS | 1.000000000 | HE193 | 1.00000000 | 149.697 |
| 18 | 143.909393739 | 39.312156678 | CAF2HL | 1.55848720 | 117.562 |
| 19 | 170.361039751 | 1.000000000 | HE193 | 1.00000000 | 106.663 |
| 20 | 127.368697185 | 33.064705940 | CAF2HL | 1.55648720 | 99.558 |
| 21 | 149.757517850 | 27.658696477 | HE193 | 1.00000000 | 88.267 |
| 22 | 893.404652749 | 8.000000000 | CAF2HL | 1.55846720 | 85.687 |
| 23 | 85.474739309 | 42.082501866 | HE193 | 1.00000000 | 67.021 |
| 24 | −554.412838267 | 8.000000000 | CAF2HL | 1.55584720 | 65.854 |
| 25 | 133.887772925AS | 36.097576773 | HE193 | 1.00000000 | 63.605 |
| 26 | −202.032636775 | 8.000000000 | CAF2HL | 1.55848720 | 64.919 |
| 27 | 1368.827229050 | 39.670298843 | HE193 | 1.00000000 | 68.993 |
| 28 | −87.722719327 | 8.150939605 | CAF2HL | 1.55848720 | 70.057 |
| 29 | −341.867554503AS | 7.243142706 | HE193 | 1.00000000 | 89.680 |
| 30 | −270.393973331 | 34.812062471 | CAF2HL | 1.55848720 | 92.272 |
| 31 | −131.925970131 | 1.000000000 | HE193 | 1.00000000 | 97.490 |
| 32 | −356.379287278 | 37.218470508 | CAF2HL | 1.55848720 | 109.741 |
| 33 | −160.486739217 | 1.000000000 | HE193 | 1.00000000 | 113.010 |

TABLE 5-continued

| SURFACE | RADII | THICKNESS | LENSES | REFRACTIVE INDEX ???.?? nm | ½ FREE DIAMETER |
|---|---|---|---|---|---|
| 34 | 728.417353977AS | 44.411516365 | CAF2HL | 1.55848720 | 121.086 |
| 35 | −285.991760803 | 26.777077207 | HE193 | 1.00000000 | 121.404 |
| 36 | −169.413078236 | 8.0000000000 | CAF2HL | 1.55848720 | 120.698 |
| 37 | 1233.439177430 | 5.704973599 | HE193 | 1.00000000 | 135.519 |
| 38 | 1968.954811160 | 42.925033480 | CAF2HL | 1.55848720 | 136.862 |
| 39 | −334.43642628 | 1.000000000 | HE193 | 1.00000000 | 138.799 |
| 40 | 448.462885926 | 53.515273929 | CAF2HL | 1.55848720 | 145.983 |
| 41 | −481.77822359AS | 38.864604302 | HE193 | 1.00000000 | 145.641 |
| 42 | −257.207339099 | 39.651511432 | CAF2HL | 1.55848720 | 141.395 |
| 43 | −352.351244424AS | 8.074724759 | HE193 | 1.00000000 | 146.219 |
| 44 | 0.000000000 | 8.135112666 | HE193 | 1.00000000 | 142.806 |
| 45 | 1571.538613070 | 41.393617207 | CAF2HL | 1.55848720 | 143.060 |
| 46 | −395.530190939 | 4.955628551 | HE193 | 1.00000000 | 142.883 |
| 47 | 189.594554041 | 44.893603417 | CAF2HL | 1.55848720 | 122.058 |
| 48 | 737.400220721AS | 1.254530428 | HE193 | 1.00000000 | 117.739 |
| 49 | 113.971025132 | 34.168140572 | CAP2HL | 1.55048720 | 91.979 |
| 50 | 186.560340242 | 1.000000000 | HE193 | 1.00000000 | 85.029 |
| 51 | 124.935012572 | 92.227373544 | CAF2HL | 1.55848720 | 76.952 |
| 52 | 0.000000000 | 0.050000026 | IMMERS | 1.3700000 | 11.068 |
| 53 | 0.000000000 | 0.000000000 | | 1.00000000 | 11.000 |

TABLE 6

ASPHERIC CONSTANTS

SURFACE NO. 4

| K | 7.3905 |
|---|---|
| C1 | 2.19490389e−007 |
| C2 | −3.18478613e−011 |
| C3 | 2.65699241e−015 |
| C4 | −3.54396715e−019 |
| C5 | 1.30925174e−023 |
| C6 | 2.26447806e−027 |
| C7 | −2.54478129e−031 |
| C8 | 0.00000000e+000 |
| C9 | 0.00000000e+000 |

SURFACE NO. 6

| K | 0.6253 |
|---|---|
| C1 | −1.14294859e−007 |
| C2 | 1.87842380e−011 |
| C3 | −1.79164088e−015 |
| C4 | 2.34304280e−019 |
| C5 | −2.31194499e−023 |
| C6 | 1.12536497e−027 |
| C7 | −2.03074756e−032 |
| C8 | 0.00000000e+000 |
| C9 | 0.00000000E+000 |

SURFACE NO. 17

| K | 0.7878 |
|---|---|
| C1 | −3.05430457e−010 |
| C2 | −4.89773138e−014 |
| C3 | 1.06923190e−018 |
| C4 | −1.47516954e−023 |
| C5 | 1.34357246e−027 |
| C6 | −5.23906420e−032 |
| C7 | 8.17069597e−037 |
| C8 | 0.00000000e+000 |
| C9 | 0.00000000e+000 |

SURFACE NO. 25

| K | 0.0013 |
|---|---|
| C1 | −6.90183181e−008 |
| C2 | −2.08803493e−012 |
| C3 | −3.48958288e−016 |

TABLE 6-continued

ASPHERIC CONSTANTS

| C4 | −3.58451964e−020 |
|---|---|
| C5 | 2.16254654e−023 |
| C6 | −3.98801026e−027 |
| C7 | 6.60002235e−031 |
| C8 | 0.00000000e+000 |
| C9 | 0.00000000e+000 |

SURFACE NO. 29

| K | −0.0334 |
|---|---|
| C1 | 3.02609727e−008 |
| C2 | −3.89225347e−012 |
| C3 | −2.10302538e−017 |
| C4 | 1.38850354e−020 |
| C5 | −1.75136031e−024 |
| C6 | 9.45164389e−029 |
| C7 | −4.34831631e−033 |
| C8 | 0.00000000e+000 |
| C9 | 0.00000000e+000 |

SURFACE NO. 34

| K | 1.5440 |
|---|---|
| C1 | −3.43367330e−009 |
| C2 | −1.34450662e−014 |
| C3 | −2.29266384e−018 |
| C4 | 9.75729876e−023 |
| C5 | −1.35202712e−026 |
| C6 | 8.80518329e−031 |
| C7 | −2.65068179e−035 |
| C8 | 0.00000000e+000 |
| C9 | 0.00000000e+000 |

SURFACE NO. 41

| K | 0.0872 |
|---|---|
| C1 | 3.26909809e−009 |
| C2 | 7.76009100e−014 |
| C3 | −3.82550397e−018 |
| C4 | 2.28007850e−023 |
| C5 | −2.34153651e−028 |
| C6 | 1.34376006e−032 |
| C7 | −1.01621932e−036 |
| C8 | 0.00000000e+000 |
| C9 | 0.00000000e+000 |

SURFACE NO. 43

| K | 0.0312 |
|---|---|
| C1 | −4.99867832e−010 |
| C2 | 1.15316140e−013 |

TABLE 6-continued

ASPHERIC CONSTANTS

| | |
|---|---|
| C3 | −1.41640795e−018 |
| C4 | 7.05365641e−023 |
| C5 | −2.43649494e−027 |
| C6 | 6.83361566e−032 |
| C7 | −6.25588420e−037 |
| C8 | 0.00000000e+000 |
| C9 | 0.00000000e+000 |

SURFACE NO.48

| | |
|---|---|
| K | −1.8716 |
| C1 | −4.01414746e−009 |
| C2 | 1.94301708e−013 |

TABLE 6-continued

ASPHERIC CONSTANTS

| | |
|---|---|
| C3 | 4.07775064e−018 |
| C4 | −4.70574709e−022 |
| C5 | 2.42642656e−026 |
| C6 | −8.38949812e−031 |
| C7 | 1.38189311e−035 |
| C8 | 0.00000000e+000 |
| C9 | 0.00000000e+000 |

TABLE 7

| SURFACE | RADII | THICKNESSES | LENSES | REFRACTIVE INDEX 157.6 nm | ½ FREE DIAMETER |
|---|---|---|---|---|---|
| 0 | 0.000000000 | 21.980160000 | | | 55.000 |
| 1 | 0.000000000 | 5.694922030 | | | 55.974 |
| 2 | −683.877082960 | 8.000016965 | CAF2HL | 1.55848720 | 60.653 |
| 3 | 241.884516194 | 13.492175419 | | | 64.060 |
| 4 | −561.327374916AS | 8.000000000 | CAF2HL | 1.55848720 | 65.556 |
| 5 | 699.454774317 | 23.282413511 | | | 69.867 |
| 6 | 400.792577467AS | 11.762291230 | CAF2HL | 1.55848720 | 88.232 |
| 7 | 293.294615517 | 22.385188600 | | | 92.839 |
| 8 | −1055.962319550 | 71.454892862 | CAF2HL | 1.55848720 | 95.242 |
| 9 | −483.111728442 | 2.387928569 | | | 124.181 |
| 10 | −967.495111648 | 48.847817148 | CAF2HL | 1.55848720 | 130.362 |
| 11 | −235.898512938 | 5.659224997 | | | 136.444 |
| 12 | −579.940954244 | 54.879651202 | CAF2HL | 1.55848720 | 145.324 |
| 13 | −221.837621898 | 1.000000000 | | | 149.602 |
| 14 | −775.372223325 | 15.081823940 | CAF2HL | 1.55848720 | 147.807 |
| 15 | −525.919668017 | 1.000000000 | | | 148.157 |
| 16 | 660.302511324 | 38.720317303 | CAF2HL | 1.55848720 | 144.440 |
| 17 | −732.467949129AS | 1.000000000 | | | 143.303 |
| 18 | 147.955956945 | 38.541140120 | CAF2HL | 1.55848720 | 116.315 |
| 19 | 174.954421407 | 1.000000000 | | | 105.360 |
| 20 | 118.333525649 | 33.404122786 | CAF2HL | 1.55848720 | 96.491 |
| 21 | 140.216192098 | 25.013496674 | | | 85.972 |
| 22 | 788.027919344 | 8.457239690 | CAF2HL | 1.55848720 | 83.494 |
| 23 | 83.028332631 | 41.178404325 | | | 65.374 |
| 24 | −597.396381251 | 8.000000000 | CAF2HL | 1.55848720 | 64.284 |
| 25 | 136.956016017AS | 31.536496068 | | | 62.327 |
| 26 | −200.199292002 | 8.000000000 | CAF2HL | 1.55848720 | 63.210 |
| 27 | 1850.730497800 | 43.442178500 | | | 66.958 |
| 28 | −86.362069271 | 8.210360232 | CAF2HL | 1.55848720 | 69.385 |
| 29 | −360.179459570AS | 7.567422592 | | | 89.255 |
| 30 | −280.601605332 | 34.872981631 | CAF2HL | 1.55848720 | 92.027 |
| 31 | −132.713962995 | 1.004709559 | | | 97.215 |
| 32 | −361.662148157 | 37.722697596 | CAF2HL | 1.55848720 | 109.325 |
| 33 | −159.165877620 | 1.000000000 | | | 112.571 |
| 34 | 750.946018427AS | 43.541363913 | CAP3HL | 1.55848720 | 120.144 |
| 35 | −285.806553705 | 25.930047100 | | | 120.440 |
| 36 | −169.581349559 | 8.030377840 | CAF2HL | 1.55848720 | 119.789 |
| 37 | 1077.110485570 | 5.682989489 | | | 134.185 |
| 38 | 1605.653205960 | 43.332820801 | CAF2HL | 1.55848720 | 135.539 |
| 39 | −333.794563037 | 1.000000000 | | | 137.425 |
| 40 | 448.584289713 | 52.027765048 | CAF2HL | 1.55848720 | 144.043 |
| 41 | −487.266144069AS | 37.362834300 | | | 143.681 |
| 42 | −256.080121302 | 40.279714930 | CAF2HL | 1.55848720 | 139.838 |
| 43 | −353.759022671AS | 7.564240001 | | | 144.656 |
| 44 | 0.0000000000 | 10.832272687 | | | 141.334 |
| 45 | 1499.148900820 | 42.690870531 | CAP2HL | 1.55848720 | 141.660 |
| 46 | −394.545474104 | 2.390581943 | | | 141.445 |
| 47 | 188.988736298 | 43.117430646 | CAF2HL | 1.55848720 | 121.630 |
| 48 | 731.593986095AS | 1.000000000 | | | 117.999 |
| 49 | 114.385997039 | 33.926813476 | CAF2HL | 1.55848720 | 92.421 |
| 50 | 184.018639075 | 1.0000000000 | | | 85.485 |

TABLE 7-continued

| SURFACE | RADII | THICKNESSES | LENSES | REFRACTIVE INDEX 157.6 nm | ½ FREE DIAMETER |
|---|---|---|---|---|---|
| 51 | 123.357013160 | 93.333990149 | CAF2HL | 1.55848720 | 77.332 |
| 52 | 0.000000000 | 0.050000000 | Immersion | 1.37000000 | 11.068 |
| 53 | 0.000000000 | 0.000000000 | | | 11.000 |

TABLE 8

ASPHERIC CONSTANTS

SURFACE NO. 4

| K | 2.4096 |
|---|---|
| C1 | 2.24623581e−007 |
| C2 | −3.32717029e−011 |
| C3 | 2.75211747e−015 |
| C4 | −3.79240993e−019 |
| C5 | 1.61861324e−023 |
| C6 | 2.15578277e−027 |
| C7 | −2.81811737e−031 |
| C8 | 0.00000000e+000 |
| C9 | 0.00000000e+000 |

SURFACE NO. 6

| K | 1.5259 |
|---|---|
| C1 | −1.12174954e−007 |
| C2 | 1.85234618e−011 |
| C3 | −1.79384980e−015 |
| C4 | 2.32576675e−019 |
| C5 | −2.32368876e−023 |
| C6 | 1.17478944e−027 |
| C7 | −2.27644098e−032 |
| C8 | 0.00000000e+000 |
| C9 | 0.00000000e+000 |

SURFACE NO. 17

| K | 1.0238 |
|---|---|
| C1 | −4.04184504e−010 |
| C2 | −5.52221230e−014 |
| C3 | 1.07792813e−018 |
| C4 | −9.68577933e−024 |
| C5 | 1.93184487e−027 |
| C6 | −7.97233584e−032 |
| C7 | 1.33745628e−036 |
| C8 | 0.00000000e+000 |
| C9 | 0.00000000e+000 |

SURFACE NO. 25

| K | 0.0096 |
|---|---|
| C1 | −6.73676580e−008 |
| C2 | −2.66011173e−012 |
| C3 | −4.29260639e−016 |
| C4 | −8.53658144e−020 |
| C5 | 3.61027613e−023 |
| C6 | −7.30829628e−027 |
| C7 | 1.01538199e−030 |
| C8 | 0.00000000e+000 |
| C9 | 0.00000000e+000 |

SURFACE NO. 29

| K | −0.2765 |
|---|---|
| C1 | 3.11326863e−008 |
| C2 | −4.09777758e−012 |
| C3 | −6.25656384e−018 |
| C4 | 1.47181039e−020 |
| C5 | −1.67738576e−024 |
| C6 | 7.46976419e−029 |
| C7 | −2.84782511e−033 |
| C8 | 0.00000000e+000 |
| C9 | 0.00000000e+000 |

SURFACE NO. 34

| K | 1.5943 |
|---|---|
| C1 | −3.41875063e−009 |

TABLE 8-continued

ASPHERIC CONSTANTS

| C2 | −1.06207572e−014 |
|---|---|
| C3 | −2.75870187e−018 |
| C4 | 1.25443795e−022 |
| C5 | −1.53842992e−026 |
| C6 | 9.81335165e−031 |
| C7 | −2.88557010e−035 |
| C8 | 0.00000000e+000 |
| C9 | 0.00000000e+000 |

SURFACE NO. 41

| K | 0.1099 |
|---|---|
| C1 | 3.24105758e−009 |
| C2 | 7.37348572e−014 |
| C3 | −3.58460435e−018 |
| C4 | 2.55537441e−023 |
| C5 | −1.78486202e−028 |
| C6 | 1.62622698e−032 |
| C7 | −1.16103266e−036 |
| C8 | 0.00000000e+000 |
| C9 | 0.00000000e+000 |

SURFACE NO. 43

| K | 0.0331 |
|---|---|
| C1 | −4.94661761e−010 |
| C2 | 1.05503739e−013 |
| C3 | −1.45124835e−018 |
| C4 | 6.84809756e−023 |
| C5 | −2.60450711e−027 |
| C6 | 7.57276741e−032 |
| C7 | −7.11474674e−037 |
| C8 | 0.00000000e+000 |
| C9 | 0.00000000e+000 |

SURFACE NO. 48

| K | −1.8262 |
|---|---|
| C1 | −4.00081230e−009 |
| C2 | 1.92491101e−013 |
| C3 | 3.74976393e−018 |
| C4 | −4.50566284e−022 |
| C5 | 2.41249474e−026 |
| C6 | −8.61661412e−031 |
| C7 | 1.44171993e−035 |
| C8 | 0.00000000e+000 |
| C9 | 0.00000000e+000 |

TABLE 9

| SURFACE | RADII | THICKNESSES | LENSES | REFRACTIVE INDEX 193.368 nm | ½ FREE DIAMETER |
|---|---|---|---|---|---|
| 0 | 0.000000000 | 21.980160000 | | 1.00000000 | 56.080 |
| 1 | 0.000000000 | 3.246888384 | L710 | 0.99998200 | 61.197 |
| 2 | −7758.872975441 | 8.000000000 | SI02HL | 1.56028900 | 61.896 |
| 3 | 359.789183967 | 7.529172915 | HE193 | 0.99971200 | 63.992 |
| 4 | −1890.369849282AS | 8.000000000 | SI02HL | 1.56028900 | 65.078 |
| 5 | 268.213281609 | 15.157771412 | HE193 | 0.99971200 | 68.460 |
| 6 | 3183.174654849AS | 8.000000000 | SI02HL | 1.56028900 | 72.301 |
| 7 | 542.737427921 | 25.228019508 | HE193 | 0.99971200 | 76.281 |
| 8 | −190.186659474 | 54.303344531 | SI02HL | 1.56028900 | 78.244 |
| 9 | −200.972554549 | 1.000000000 | HE193 | 0.99971200 | 102.934 |
| 10 | −1181.739114120 | 41.618091168 | SI02HL | 1.56028900 | 116.315 |
| 11 | −200.599781289 | 1.000000000 | HE193 | 0.99971200 | 119.335 |
| 12 | −345.801617038 | 34.756009233 | SI02HL | 1.56028900 | 122.895 |
| 13 | −183.035949037 | 1.000000000 | HE193 | 0.99971200 | 125.001 |
| 14 | 468.598304219 | 28.888366130 | SI02HL | 1.56028900 | 119.583 |
| 15 | −1579.330378954AS | 1.000000000 | HE193 | 0.99971200 | 118.410 |
| 16 | 130.622577421 | 25.607493426 | SI02HL | 1.56028900 | 101.535 |
| 17 | 167.663755864 | 1.000000000 | HE193 | 0.99971200 | 96.903 |
| 18 | 109.515012627 | 33.485629573 | SI02HL | 1.56028900 | 88.871 |
| 19 | 139.897752069 | 27.284753341 | HE193 | 0.99971200 | 79.284 |
| 20 | 8434.054206242 | 8.000000000 | SI02HL | 1.56028900 | 76.872 |
| 21 | 75.280373304 | 30.508120723 | HE193 | 0.99971200 | 60.167 |
| 22 | 712.917049547 | 6.000000000 | SI02HL | 1.56028900 | 59.980 |
| 23 | 137.047990149AS | 41.376149828 | HE193 | 0.99971200 | 58.756 |
| 24 | −120.168111858 | 8.000000000 | SI02HL | 1.56028900 | 60.070 |
| 25 | −335.689995101 | 26.955101014 | HE193 | 0.99971200 | 64.725 |
| 26 | −86.294324443 | 6.405631441 | SI02HL | 1.56028900 | 65.622 |
| 27 | −401.221976575AS | 6.791819241 | HE193 | 0.99971200 | 82.386 |
| 28 | −295.528316934 | 33.017957091 | SI02HL | 1.56028900 | 84.761 |
| 29 | −156.211920694 | 1.000000000 | HE193 | 0.99971200 | 93.276 |
| 30 | −268.979137216 | 33.049041389 | SI02HL | 1.56028900 | 99.716 |
| 31 | −143.116329961 | 1.000000000 | HE193 | 0.99971200 | 103.445 |
| 32 | 472.893981029AS | 41.687451272 | SI02HL | 1.56028900 | 115.709 |
| 33 | −346.217421641 | 22.889302349 | HE193 | 0.99971200 | 116.094 |
| 34 | −187.601096847 | 12.645469238 | SI02HL | 1.56028900 | 115.710 |
| 35 | −359.852656461 | 1.000000000 | HE193 | 0.99971200 | 121.777 |
| 36 | 722.017664882 | 60.459509481 | SI02HL | 1.56028900 | 125.218 |
| 37 | −1816.432711561AS | 24.260458335 | HE193 | 0.99971200 | 125.322 |
| 38 | 2199.280274610 | 24.178147653 | SI02HL | 1.56028900 | 124.815 |
| 39 | −1512.556721825 | 8.000000000 | HE193 | 0.99971200 | 124.440 |
| 40 | 0.0000000000 | 14.309578556 | HE193 | 0.99971200 | 123.088 |
| 41 | 1738.196399601 | 39.559449287 | SI02HL | 1.56028900 | 124.310 |
| 42 | −429.627570104AS | 1.000000000 | HE193 | 0.99971200 | 124.575 |
| 43 | 179.589102742 | 55.687793359 | SI02HL | 1.56028900 | 115.507 |
| 44 | 589.027987143AS | 10.530033379 | HE193 | 0.99971200 | 105.186 |
| 45 | 136.621156961 | 53.097791469 | SI02HL | 1.56028900 | 89.320 |
| 46 | 137.713831680 | 1.000000000 | HE193 | 0.99971200 | 67.001 |
| 47 | 93.326477153 | 90.505495277 | SI02HL | 1.56028900 | 62.339 |
| 48 | 0.000000000 | 1.000000545 | IMMERS | 1.56000000 | 14.735 |
| 49 | 0.000000000 | 0.000000000 | | 1.00000000 | 14.020 |

TABLE 10

ASPHERIC CONSTANTS

SURFACE NO. 4

| K | 0.0000 |
|---|---|
| C1 | 2.81531001e−007 |
| C2 | −3.99703415e−011 |
| C3 | 2.76850090e−015 |
| C4 | −4.54887122e−019 |
| C5 | −5.66904777e−024 |
| C6 | 5.03662466e−027 |
| C7 | −4.52060360e−031 |
| C8 | 0.00000000e+000 |
| C9 | 0.00000000e+000 |

SURFACE NO. 6

| K | 0.000 |
|---|---|
| C1 | −1.16706261e−007 |
| C2 | 2.00348321e−011 |

TABLE 10-continued

ASPHERIC CONSTANTS

| C3 | 1.51130378e−015 |
|---|---|
| C4 | 3.09660955e−019 |
| C5 | −1.78658993e−023 |
| C6 | 3.15835636e−027 |
| C7 | −4.23595936e−031 |
| C8 | 0.00000000e+000 |
| C9 | 0.00000000e+000 |

SURFACE NO. 15

| K | 0.0000 |
|---|---|
| C1 | −9.37924970e−010 |
| C2 | −2.58161066e−013 |
| C3 | −5.12306559e−018 |
| C4 | 1.80598481e−022 |
| C5 | 3.60539800e−027 |
| C6 | 3.85878819e−031 |
| C7 | −3.50550744e−037 |

TABLE 10-continued

ASPHERIC CONSTANTS

| | | |
|---|---|---|
| | C8 | 0.00000000e+000 |
| | C9 | 0.00000000e+000 |
| SURFACE NO. 23 | | |
| | K | 0.0000 |
| | C1 | −9.05676602e−008 |
| | C2 | −7.64727914e−013 |
| | C3 | −9.31867049e−016 |
| | C4 | 9.20035750e−020 |
| | C5 | −9.15433014e−023 |
| | C6 | 1.32736186e−026 |
| | C7 | −9.23872382e−031 |
| | C8 | 0.00000000e+000 |
| | C9 | 0.00000000e+000 |
| SURFACE NO. 27 | | |
| | K | 0.0000 |
| | C1 | 2.51519254e−008 |
| | C2 | −4.37829106e−012 |
| | C3 | 2.68987386e−017 |
| | C4 | 1.45024261e−020 |
| | C5 | −1.31152094e−024 |
| | C6 | 1.04857156e−030 |
| | C7 | −9.21174949e−034 |
| | C8 | 0.00000000e+000 |
| | C9 | 0.00000000e+000 |
| SURFACE NO. 32 | | |
| | K | 0.0000 |
| | C1 | −2.59168418e−009 |
| | C2 | −8.93760219e−014 |
| | C3 | −4.25486946e−018 |
| | C4 | 3.13097668e−022 |
| | C5 | −1.87333640e−026 |
| | C6 | 1.28572875e−030 |
| | C7 | −3.94471730e−035 |
| | C8 | 0.00000000e+000 |
| | C9 | 0.00000000e+000 |
| SURFACE NO. 37 | | |
| | K | 0.0000 |
| | C1 | 3.92265908e−009 |
| | C2 | 5.90432031e−014 |
| | C3 | −4.61273256e−018 |
| | C4 | 5.09437288e−023 |

What is claimed is:

1. Refractive projection objective for projecting a pattern arranged in an object plane of the projection objective into an image plane of the projection objective with the aid of an immersion medium which is arranged between a last optical element of the projection objective and the image plane, comprising:
a first lens group, following the object plane, with a negative refracting power;
a second lens group, following the first lens group, with a positive refracting power;
a third lens group, following the second lens group, with a negative refracting power;
a fourth lens group, following the third lens group, with a positive refracting power;
a fifth lens group, following the fourth lens group, with a positive refracting power; and
a system aperture which is arranged in the region of maximum beam diameter between the fourth and the fifth lens group.

2. Projection objective according to claim 1, wherein the system aperture lies between a plane of maximum beam diameter near the image and the image plane.

3. Projection objective according to claim 1 having an image-side numerical aperture of NA≧0.9.

4. Projection objective according to claim 3 having an image-side numerical aperture of at least NA=1.0.

5. Projection objective according to claim 1, wherein the projection objective is adapted to an immersion medium which has a refractive index of n<1.3 at an operating wavelength.

6. Projection objective according to claim 1, wherein the projection objective has an image-side working distance of between approximately 10 μm and approximately 200 μm.

7. Projection objective according to claim 1, wherein a ratio between the focal length of the fourth lens group and the focal length of the fifth lens group is between approximately 0.9 and approximately 1.1.

8. Projection objective according to claim 1, wherein a ratio of the magnitudes of the focal lengths of the first lens group and the fifth lens group is between approximately 0.7 and approximately 1.3.

9. Projection objective according to claim 1, wherein a ratio between an overall length of the projection objective and the focal length of the fifth lens group is greater than five.

10. Projection objective according to claim 1, wherein the first lens group includes at least one aspheric surface.

11. Projection objective according to claim 1, wherein at least one aspheric surface is provided in the third lens group.

12. Projection objective according to claim 1, wherein not more than nine aspheric surfaces are provided.

13. Projection objective according to claim 1, wherein at least one meniscus lens, convex relative to the object plane, with a negative refracting power is arranged in a near zone of the object plane.

14. Projection objective according to claim 1, wherein the second lens group has at least four consecutive lenses with a positive refracting power.

15. Projection objective according to claim 1, wherein the second lens group has at least one of at least one meniscus lens concave relative to the object plane, with a positive refracting power on an entry side facing the object plane and at least one meniscus lens convex relative to the object plane, with a positive refracting power on the exit side facing the image plane.

16. Projection objective according to claim 1, wherein the second lens group in this sequence has at least one meniscus lens, concave relative to the object plane, with a positive refracting power, a biconvex positive lens and at least one meniscus lens, concave relative to the image plane, with a positive refracting power.

17. Projection objective according to claim 1, wherein the third lens group has only lenses with a negative refracting power.

18. Projection objective according to claim 1, wherein, with reference to a plane of symmetry lying inside the third lens group, the third lens group is of substantially symmetrical construction.

19. Projection objective according to claim 1, wherein two oppositely curved, concave surfaces directly opposed to one another in the third lens group are surrounded by two concave surfaces which are concave relative to one another.

20. Projection objective according to claim 1, wherein an exit region, facing the third lens group, of the second lens group, and an entry region, following the third lens group, of the fourth lens group are constructed substantially symmetrically relative to a plane of symmetry lying inside the third lens group.

21. Projection objective according to claim 1, wherein the fourth lens group has at least one doublet with a biconvex positive lens and a downstream negative meniscus lens with lens surfaces which are concave towards the object.

22. Projection objective according to claim 1, wherein in an object-side entry region the fourth lens group has at least one meniscus lens, concave relative to the object plane, with a positive refracting power.

23. Projection objective according to claim 1, wherein the sine of the maximum incidence angle of the radiation impinging on the optical surfaces is less than 90% of the image-side numerical aperture.

24. Projection objective according to claim 23, wherein the sine of the maximum incidence angle of the radiation impinging on the optical surfaces is less than 85% of the image-side numerical aperture.

25. Projection objective according to claim 1, wherein the fifth lens group has exclusively lenses with a positive refracting power.

26. Projection objective according to claim 1, wherein the fifth lens group has at least four positive lenses.

27. Projection objective according to claim 1, wherein the fifth lens group has at least one meniscus lens with a positive refracting power and lens surfaces concave towards the image.

28. Projection objective according to claim 1, wherein, as last optical element, the fifth lens group has a plano-convex lens which has an entry surface and a substantially flat exit surface.

29. Projection objective according to claim 28, wherein the plano-convex lens is constructed in a non-hemispherical fashion.

30. Projection objective according to claim 1, wherein all the lenses consist of the same material.

31. Projection objective according to claim 1 which is a single-waist system with a belly near the object, a belly remote from the object and a waist therebetween.

32. Projection objective according to claim 1, wherein the image field diameter is at least one of more than 10 mm and more than 1.0% of the overall length of the objective.

33. Projection objective according to claim 1, wherein the light conductance is more than approximately 1% of the overall length of the objective.

34. Projection objective according to claim 1, wherein at least four times as many lenses are arranged upstream of the system aperture than downstream of the system aperture.

35. Projection objective according to claim 1, wherein at least five lenses with a positive refracting power are arranged between a waist of the projection objective and the system aperture.

36. Projection objective according to claim 31, wherein a distance between the waist and the system aperture is at least 26% of the overall length of the objective.

37. Projection objective according to claim 1, wherein a maximum rim ray height is at least twice as large as the rim ray height at the location of narrowest constriction of rays.

38. Projection exposure machine for microlithography, having a refractive projection objective for projecting a pattern arranged in an object plane of the projection objective into an image plane of the projection objective with the aid of an immersion medium which is arranged between a last optical element of the projection objective and the image plane, comprising:
a first lens group, following the object plane, with a negative refracting power;
a second lens group, following the first lens group, with a positive refracting power;
a third lens group, following the second lens group, with a negative refracting power;
a fourth lens group, following the third lens group, with a positive refracting power;
a fifth lens group, following the fourth lens group, with a positive refracting power; and
a system aperture which is arranged in the region of maximum beam diameter between the fourth and the fifth lens group.

39. Method for producing semiconductor components and other finely structured structural elements comprising:
providing a mask with a prescribed pattern;
illuminating the mask with ultraviolet light of a prescribed wavelength; and
projecting an image of the pattern onto a photosensitive substrate, arranged in the region of the image plane of a projection objective, with the aid of a projection objective having:
a first lens group, following the object plane, with a negative refracting power;
a second lens group, following the first lens group, with a positive refracting power;
a third lens group, following the second lens group, with a negative refracting power;
a fourth lens group, following the third lens group, with a positive refracting power;
a fifth lens group, following the fourth lens group, with a positive refracting power; and
a system aperture which is arranged in the region of maximum beam diameter between the fourth and the fifth lens group;
an immersion medium arranged between a last optical surface of the projection objective and the substrate being trans-illuminated during the projection.

40. Refractive projection objective for projecting a pattern arranged in an object plane of the projection objective into an image plane of the projection objective with the aid of an immersion medium which is arranged between a last optical element of the projection objective and the image plane, comprising:
a first lens group, following the object plane, with a negative refracting power;
a second lens group, following the first lens group, with a positive refracting power;
a third lens group, following the second lens group, with a negative refracting power;
a fourth lens group, following the third lens group, with a positive refracting power;
a fifth lens group, following the fourth lens group, with a positive refracting power; and
a system aperture which is arranged between the fourth and the fifth lens group,
wherein an image-side numerical aperture is NA$\geq$0.9.

41. Projection objective according to claim 40, wherein the system aperture lies between a plane of maximum beam diameter near the image and the image plane.

42. Projection objective according to claim 40 having an image-side numerical aperture of at least NA=1.0.

43. Projection objective according to claim 40, wherein the projection objective is adapted to an immersion medium which has a refractive index of n<1.3 at an operating wavelength.

44. Projection objective according to claim 40, wherein the projection objective has an image-side working distance of between approximately 10 $\mu$m and approximately 200 $\mu$m.

45. Projection objective according to claim 40, wherein a ratio between the focal length of the fourth lens group and the focal length of the fifth lens group is between approximately 0.9 and approximately 1.1.

46. Projection objective according to claim 40, wherein a ratio of the magnitudes of the focal lengths of the first lens group and the fifth lens group is between approximately 0.7 and approximately 1.3.

47. Projection objective according to claim 40, wherein a ratio between an overall length of the projection objective and the focal length of the fifth lens group is greater than five.

48. Projection objective according to claim 40, wherein the first lens group includes at least one aspheric surface.

49. Projection objective according to claim 40, wherein at least one aspheric surface is provided in the third lens group.

50. Projection objective according to claim 40, wherein not more than nine aspheric surfaces are provided.

51. Projection objective according to claim 40, wherein at least one meniscus lens, convex relative to the object plane, with a negative refracting power is arranged in a near zone of the object plane.

52. Projection objective according to claim 40, wherein the second lens group has at least four consecutive lenses with a positive refracting power.

53. Projection objective according to claim 40, wherein the second lens group has at least one of at least one meniscus lens concave relative to the object plane, with a positive refracting power on an entry side facing the object plane and at least one meniscus lens convex relative to the object plane, with a positive refracting power on the exit side facing the image plane.

54. Projection objective according to claim 40, wherein the second lens group in this sequence has at least one meniscus lens, concave relative to the object plane, with a positive refracting power, a biconvex positive lens and at least one meniscus lens, concave relative to the image plane, with a positive refracting power.

55. Projection objective according to claim 40, wherein the third lens group has only lenses with a negative refracting power.

56. Projection objective according to claim 40, wherein, with reference to a plane of symmetry lying inside the third lens group, the third lens group is of substantially symmetrical construction.

57. Projection objective according to claim 40, wherein two oppositely curved, concave surfaces directly opposed to one another in the third lens group are surrounded by two concave surfaces which are concave relative to one another.

58. Projection objective according to claim 40, wherein an exit region, facing the third lens group, of the second lens group, and an entry region, following the third lens group, of the fourth lens group are constructed substantially symmetrically relative to a plane of symmetry lying inside the third lens group.

59. Projection objective according to claim 40, wherein the fourth lens group has at least one doublet with a biconvex positive lens and a downstream negative meniscus lens with lens surfaces which are concave towards the object.

60. Projection objective according to claim 40, wherein in an object-side entry region the fourth lens group has at least one meniscus lens, concave relative to the object plane, with a positive refracting power.

61. Projection objective according to claim 40, wherein the sine of the maximum incidence angle of the radiation impinging on the optical surfaces is less than 90% of the image-side numerical aperture.

62. Projection objective according to claim 61, wherein the sine of the maximum incidence angle of the radiation impinging on the optical surfaces is less than 85% of the image-side numerical aperture.

63. Projection objective according to claim 40, wherein the fifth lens group has exclusively lenses with a positive refracting power.

64. Projection objective according to claim 40, wherein the fifth lens group has at least four positive lenses.

65. Projection objective according to claim 40, wherein the fifth lens group has at least one meniscus lens with a positive refracting power and lens surfaces concave towards the image.

66. Projection objective according to claim 40, wherein, as last optical element, the fifth lens group has a plano-convex lens which has an entry surface and a substantially flat exit surface.

67. Projection objective according to claim 66, wherein the plano-convex lens is constructed in a non-hemispherical fashion.

68. Projection objective according to claim 40, wherein all the lenses consist of the same material.

69. Projection objective according to claim 40 which is a single-waist system with a belly near the object, a belly remote from the object and a waist therebetween.

70. Projection objective according to claim 40, wherein the image field diameter is at least one of more than 10 mm and more than 1.0% of the overall length of the objective.

71. Projection objective according to claim 40, wherein the light conductance is more than approximately 1% of the overall length of the objective.

72. Projection objective according to claim 40, wherein at least four times as many lenses are arranged upstream of the system aperture than downstream of the system aperture.

73. Projection objective according to claim 40, wherein at least five lenses with a positive refracting power are arranged between a waist of the projection objective and the system aperture.

74. Projection objective according to claim 73, wherein a distance between the waist and the system aperture is at least 26% of the overall length of the objective.

75. Projection objective according to claim 40, wherein a maximum rim ray height is at least twice as large as the rim ray height at the location of narrowest constriction of rays.

76. Projection exposure machine for microlithography, having a refractive projection objective for projecting a pattern arranged in an object plane of the projection objective into an image plane of the projection objective with the aid of an immersion medium which is arranged between a last optical element of the projection objective and the image plane, comprising:

a first lens group, following the object plane, with a negative refracting power;

a second lens group, following the first lens group, with a positive refracting power;

a third lens group, following the second lens group, with a negative refracting power;

a fourth lens group, following the third lens group, with a positive refracting power;

a fifth lens group, following the fourth lens group, with a positive refracting power; and a system aperture which is arranged between the fourth and the fifth lens group, wherein an image-side numerical aperture is $NA \geq 0.9$.

77. Method for producing semiconductor components and other finely structured structural elements comprising:

providing a mask with a prescribed pattern;

illuminating the mask with ultraviolet light of a prescribed wavelength; and projecting an image of the pattern onto a photosensitive substrate, arranged in the region of the image plane of a projection objective, with the aid of a projection objective having:

a first lens group, following the object plane, with a negative refracting power;

a second lens group, following the first lens group, with a positive refracting power;

a third lens group, following the second lens group, with a negative refracting power;

a fourth lens group, following the third lens group, with a positive refracting power;

a fifth lens group, following the fourth lens group, with a positive refracting power; and a system aperture which is arranged between the fourth and the fifth lens group;

an immersion medium arranged between a last optical surface of the projection objective and the substrate being trans-illuminated during the projection wherein an image-side numerical aperture is NA≧0.9.

78. Refractive projection objective for projecting a pattern arranged in an object plane of the projection objective into an image plane of the projection objective with the aid of an immersion medium which is arranged between a last optical element of the projection objective and the image plane, comprising:

a first lens group, following the object plane, with a negative refracting power;

a second lens group, following the first lens group, with a positive refracting power;

a third lens group, following the second lens group, with a negative refracting power;

a fourth lens group, following the third lens group, with a positive refracting power; and a fifth lens group, following the fourth lens group, with a positive refracting power, wherein the fourth lens group has at least one doublet with a biconvex positive lens and a downstream negative meniscus lens with lens surfaces which are concave towards the object.

79. Projection objective according to claim 78 having an image-side numerical aperture of NA≧0.9.

80. Projection objective according to claim 79 having an image-side numerical aperture of at least NA=1.0.

81. Projection objective according to claim 78, wherein the fifth lens group has exclusively lenses with a positive refracting power.

82. Projection objective according to claim 78, wherein, as last optical element, the fifth lens group has a plano-convex lens which has an entry surface and a substantially flat exit surface.

83. Projection objective according to claim 82, wherein the plano-convex lens is constructed in a non-hemispherical fashion.

84. Projection objective according to claim 78 which is a single-waist system with a belly near the object, a belly remote from the object and a waist therebetween.

85. Refractive projection objective for projecting a pattern arranged in an object plane of the projection objective into an image plane of the projection objective with the aid of an immersion medium which is arranged between a last optical element of the projection objective and the image plane, comprising:

a first lens group, following the object plane, with a negative refracting power;

a second lens group, following the first lens group, with a positive refracting power;

a third lens group, following the second lens group, with a negative refracting power;

a fourth lens group, following the third lens group, with a positive refracting power; and a fifth lens group, following the fourth lens group, with a positive refracting power, wherein the fifth lens group has exclusively lenses with a positive refracting power.

86. Projection objective according to claim 85, further comprising a system aperture which is arranged between the fourth and the fifth lens group.

87. Projection objective according to claim 85, wherein the system aperture is arranged in the region of maximum beam diameter and lies between a plane of maximum beam diameter near the image and the image plane.

88. Projection objective according to claim 85 having an image-side numerical aperture of NA≧0.9.

89. Projection objective according to claim 88 having an image-side numerical aperture of at least NA=1.0.

90. Projection objective according to claim 85, wherein the fourth lens group has at least one doublet with a biconvex positive lens and a downstream negative meniscus lens with lens surfaces which are concave towards the object.

91. Projection objective according to claim 85, wherein the fifth lens group has at least four positive lenses.

92. Projection objective according to claim 85, wherein the fifth lens group has at least one meniscus lens with a positive refracting power and lens surfaces concave towards the image.

93. Projection objective according to claim 85, wherein, as last optical element, the fifth lens group has a plano-convex lens which has an entry surface and a substantially flat exit surface.

94. Projection objective according to claim 93, wherein the plano-convex lens is constructed in a non-hemispherical fashion.

95. Projection objective according to claim 85 which is a single-waist system with a belly near the object, a belly remote from the object and a waist therebetween.

96. Refractive projection objective for projecting a pattern arranged in an object plane of the projection objective into an image plane of the projection objective with the aid of an immersion medium which is arranged between a last optical element of the projection objective and the image plane, comprising:

a first lens group, following the object plane, with a negative refracting power;

a second lens group, following the first lens group, with a positive refracting power;

a third lens group, following the second lens group, with a negative refracting power;

a fourth lens group, following the third lens group, with a positive refracting power; and a fifth lens group, following the fourth lens group, with a positive refracting power, wherein an image-side numerical aperture is NA≧0.9, and a last optical element of the fifth lens group is a truncated hemispherical plano-convex lens having a convexly curved entry surface and a substantially flat exit surface.

97. Projection objective according to claim 96, further comprising a system aperture which is arranged between the fourth and the fifth lens group.

98. Projection objective according to claim 97, wherein the system aperture which is arranged in the region of maximum beam diameter.

99. Projection objective according to claim 98, wherein the system aperture which lies between a plane of maximum beam diameter near the image and the image plane.

100. Projection objective according to claim 96 having an image-side numerical aperture of at least NA=1.0.

101. Projection objective according to claim 96, wherein the fourth lens group has at least one doublet with a biconvex positive lens and a downstream negative meniscus lens with lens surfaces which are concave towards the object.

102. Projection objective according to claim 96, wherein the fifth lens group has exclusively lenses with a positive refracting power.

103. Projection objective according to claim 96 which is a single-waist system with a belly near the object, a belly remote from the object and a waist therebetween.

104. Refractive projection objective for projecting a pattern arranged in an object plane of the projection objective into an image plane of the projection objective, comprising:

a first lens group, following the object plane, with a negative refracting power;

a second lens group, following the first lens group, with a positive refracting power;

a third lens group, following the second lens group, with a negative refracting power;

a fourth lens group, following the third lens group, with a positive refracting power; and a fifth lens group, following the fourth lens group, with a positive refracting power, wherein an image-side numerical aperture is NA≧0.9, a last optical element of the fifth lens group has a substantially flat exit surface, and an image-side working distance between the exit surface of the last optical element and the image plane is set to permit sufficient light energy of an optical near-field evanescent from the exit surface to be coupled into a surface of a photosensitive substrate positioned in the image plane of the projection objective, whereby the pattern is projected onto the substrate by near-field-lithography.

105. Projection objective according to claim 104 adapted for operation wavelength of 200 nm or less and having a finite image side working distance of 100 nm or less.

106. Projection objective according to claim 104 having an image-side numerical aperture of at least NA=1.0.

107. Projection objective according to claim 104, wherein the fourth lens group has at least one doublet with a biconvex positive lens and a downstream negative meniscus lens with lens surfaces which are concave towards the object.

108. Projection objective according to claim 104, wherein the fifth lens group has exclusively lenses with a positive refracting power.

109. Projection objective according to claim 104, wherein the fifth lens group has at least four positive lenses.

110. Projection objective according to claim 104, wherein the fifth lens group has at least one meniscus lens with a positive refracting power and lens surfaces concave towards the image.

111. Projection objective according to claim 104, wherein, as last optical element, the fifth lens group has a plano-convex lens which has an entry surface and a substantially flat exit surface.

112. Projection objective according to claim 111, wherein the plano-convex lens is constructed in a non-hemispherical fashion.

113. Projection objective according to claim 104 which is a single-waist system with a belly near the object, a belly remote from the object and a waist therebetween.

* * * * *